United States Patent
Lee

(10) Patent No.: US 11,239,284 B2
(45) Date of Patent: Feb. 1, 2022

(54) DISPLAY DEVICE HAVING A COLOR FILTER

(71) Applicant: LG Display Co., Ltd., Seoul (KR)

(72) Inventor: Seung-Beum Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/040,118

(22) Filed: Jul. 19, 2018

(65) Prior Publication Data

US 2019/0035856 A1 Jan. 31, 2019

(30) Foreign Application Priority Data

Jul. 25, 2017 (KR) ........................ 10-2017-0094029

(51) Int. Cl.
| | | |
|---|---|---|
| *H01L 27/32* | (2006.01) | |
| *G02F 1/1335* | (2006.01) | |
| *H01L 51/52* | (2006.01) | |
| *H01L 27/12* | (2006.01) | |
| *G09G 3/3225* | (2016.01) | |
| *G02B 5/20* | (2006.01) | |

(52) U.S. Cl.
CPC ...... *H01L 27/322* (2013.01); *G02F 1/133514* (2013.01); *G09G 3/3225* (2013.01); *H01L 27/124* (2013.01); *H01L 27/1248* (2013.01); *H01L 27/3262* (2013.01); *H01L 27/3265* (2013.01); *H01L 27/3276* (2013.01); *H01L 51/5203* (2013.01); *G02B 5/201* (2013.01); *G02F 1/133519* (2021.01); *H01L 51/5237* (2013.01); *H01L 51/5243* (2013.01); *H01L 51/5253* (2013.01); *H01L 51/5259* (2013.01)

(58) Field of Classification Search
CPC . H01L 27/322; H01L 27/124; H01L 27/3262; H01L 27/3265; H01L 27/3276; H01L 51/5203; H01L 51/5237; G02F 1/133514; G02F 2001/133519; G09G 3/3225; G02B 5/201
See application file for complete search history.

(56) References Cited

U.S. PATENT DOCUMENTS

| | | | | |
|---|---|---|---|---|
| 2007/0090755 A1* | 4/2007 | Eida | ...................... | H01L 27/322 313/506 |
| 2007/0275624 A1* | 11/2007 | Kawaguchi | ........... | H01L 27/322 445/24 |
| 2014/0321101 A1* | 10/2014 | Kadowaki | ................. | F21V 9/40 362/84 |

(Continued)

FOREIGN PATENT DOCUMENTS

| | | |
|---|---|---|
| CN | 106647002 A | 5/2017 |
| JP | 2005-149811 A | 6/2008 |

(Continued)

*Primary Examiner* — Patrick N Edouard
*Assistant Examiner* — Eboni N Giles
(74) *Attorney, Agent, or Firm* — Seed IP Law Group LLP

(57) ABSTRACT

A display device including a color filter is provided. The display device may include at least one color conversion pattern realizing a color same as the color filter. The color conversion pattern may be surrounded by the color filter. Thus, in the display device according to the embodiment of the present disclosure, the color gamut may be improved without increasing the overall thickness of the display device.

20 Claims, 12 Drawing Sheets

(56) References Cited

U.S. PATENT DOCUMENTS

| | | | |
|---|---|---|---|
| 2016/0033816 A1* | 2/2016 | Yoon | G02F 1/133514 349/108 |
| 2016/0091641 A1 | 3/2016 | Tseng et al. | |
| 2016/0091757 A1 | 3/2016 | Miki et al. | |
| 2017/0059985 A1* | 3/2017 | Park | G02B 5/201 |
| 2017/0076678 A1* | 3/2017 | Lee | G02F 1/133514 |
| 2017/0240728 A1* | 8/2017 | Lee | H01L 51/004 |
| 2017/0351149 A1* | 12/2017 | Chu | G02F 1/133528 |
| 2018/0088404 A1* | 3/2018 | Chae | G02F 1/133514 |

FOREIGN PATENT DOCUMENTS

| | | |
|---|---|---|
| JP | 2016-070949 A | 5/2016 |
| KR | 10-2005-0029426 A | 3/2005 |
| KR | 10-2010-0056437 A | 5/2010 |
| KR | 10-2016-0017187 A | 2/2016 |
| KR | 10-2017-0026822 A | 3/2017 |
| WO | 2017/080064 A1 | 5/2017 |
| WO | 2019/017423 A1 | 1/2019 |

\* cited by examiner

DISPLAY DEVICE HAVING A COLOR FILTER

CROSS-REFERENCE TO RELATED APPLICATION

This application claims the priority benefit of Korean Patent Application No. 10-2017-0094029, filed on Jul. 25, 2017, which is hereby incorporated by reference as if fully set forth herein.

BACKGROUND

Technical Field

The present disclosure relates to a display device including a pixel region to realize a color by using a color filter.

Description of the Related Art

Generally, an electronic appliance, such as a monitor, a TV, a laptop computer, and a digital camera, include a display device to realize an image. For example, the display device may include a liquid crystal display device and/or an organic light-emitting display device.

The display device may include a plurality of pixel regions. For example, the display device may include a red pixel region realizing red color, a green pixel region realizing green color, a blue pixel region realizing blue color, and a white pixel region realizing white color.

The display device may realize a specific color by using a color filter. For example, the display device may include a red color filter disposed on the red pixel region, a green color filter disposed on the green pixel region, and a blue color filter disposed on the blue pixel region.

However, the color filter absorbs or blocks light having a specific wavelength range to realize the corresponding color, so that the brightness and efficiency of the light may be decreased due to the color filter. In addition, because the display device does not include the color filter disposed on the white pixel region, adjusting the color coordinate may be difficult due to the characteristics difference between colors realized in each pixel region.

In order to prevent decreasing characteristics of realized color due to the color filter, the display device may stack a color conversion pattern on the color filter. The color conversion pattern may generate light having a wavelength range that realizes the corresponding color using light having a wavelength shorter than the wavelength range that realizes the corresponding color. However, in the display device, the overall thickness may be increased due to the stack of the color filter and the color conversion pattern.

BRIEF SUMMARY

Accordingly, the present disclosure is directed to a display device that substantially obviates one or more problems due to limitations and disadvantages of the related art.

Various embodiments provide a display device capable of increasing the characteristics of a color realized or implemented in the pixel region having a color filter without increasing the overall thickness.

Various embodiments provide a display device in which the color coordinate may be easily adjusted.

Additional advantages and features of the present disclosure will be set forth in part in the description which follows and in part will become apparent to those having ordinary skill in the art upon examination of the following or may be learned from practice of various embodiments of the present disclosure. Other advantages of various embodiments of the present disclosure may be realized and attained by the structure particularly pointed out in the written description and claims hereof as well as the appended drawings.

To achieve these advantages, in one embodiment, there is provided a display device including an upper substrate disposed on a lower substrate. A color filter is disposed between the lower substrate and the upper substrate. The color filter includes at least one penetrating hole. A color conversion pattern is disposed in the penetrating hole of the color filter.

The color conversion pattern may realize a color that is the same as the color filter.

A side surface of the color filter and a side surface of the color conversion pattern may be tapered. The side surface of the color conversion pattern may be tapered in a direction opposite to the side surface of the color filter.

The side surface of the color filter may be positively tapered.

A color conversion layer may be disposed between the color filter and the upper substrate. The color conversion layer may be extended between the color conversion pattern and the upper substrate. A light-emitting structure may be disposed between the color conversion layer and the upper substrate. The light-emitting structure may include a lower electrode, a light-emitting layer and an upper electrode, which are sequentially stacked. An over-coat layer may be disposed between the color conversion layer and the light-emitting structure.

A thickness of the color conversion layer may be thinner than a thickness of the color filter.

The color conversion layer may include a material same as the color conversion pattern.

A thickness of the color conversion pattern may be same as the thickness of the color filter.

In one embodiment, a display device includes a lower substrate. The lower substrate includes a white pixel region and a first pixel region. The white pixel region realizes white color. The first pixel region realizes non-white color. A first color filter is disposed on the first pixel region of the lower substrate. The first color filter includes at least one first penetrating hole. A first conversion pattern is disposed in the first penetrating hole of the first color filter. A second color conversion pattern is disposed on the white pixel region of the lower substrate. In one embodiment, the second conversion pattern includes a material same as the first conversion pattern.

The number of the second color conversion pattern may be different from the number of the first color conversion pattern.

A side surface of the second color conversion pattern may be tapered in a direction same as the first color conversion pattern.

A thickness of the second color conversion pattern may be same as a thickness of the first color conversion pattern.

A second color filter may be disposed on a second pixel region of the lower substrate. The second pixel region may realize a color different from the white pixel region and the first pixel region. The second color filter may include at least one second penetrating hole. A third color conversion pattern may be disposed in the second penetrating hole of the second color filter. A fourth color conversion pattern may be disposed on the white pixel region of the lower substrate.

The number of the third color conversion pattern may be different from the number of the first color conversion pattern.

The number of the fourth color conversion pattern may be different from the number of the second color conversion pattern.

In one embodiment, a display device includes a lower substrate. The lower substrate includes a red pixel region, a green pixel region, a blue pixel region and a white pixel region. A red color filter and at least one first red color conversion pattern are disposed on the red pixel region of the lower substrate. The red color filter surrounds the first red color conversion pattern. A green color filter and at least one first green color conversion pattern are disposed on the green pixel region of the lower substrate. The green color filter surrounds the first green color conversion pattern. A blue color filter is disposed on the blue pixel region of the lower substrate. At least one second red color conversion pattern and at least one second green color conversion pattern are disposed on the white pixel region of the lower substrate.

A thickness of the second red color conversion pattern may be thicker than a thickness of the first red color conversion pattern. A thickness of the second green color conversion pattern may be thicker than a thickness of the first green color conversion pattern.

A red color conversion layer may be disposed on the red color filter and the first red color conversion pattern. A green color conversion layer may be disposed on the green color filter and the first green color conversion pattern. An upper surface of the second red color conversion pattern opposite to the lower substrate may be coplanar with an upper surface of the red color conversion layer opposite to the lower substrate. An upper surface of the second green color conversion pattern may be coplanar with an upper surface of the green color conversion layer opposite to the lower substrate.

A side surface of the second red color conversion pattern and a side surface of the second green color conversion pattern may be tapered in a direction opposite to a side surface of the first red color conversion pattern and a side surface of the first green color conversion pattern.

The sides surfaced of the first red color conversion pattern and the side surface of the first green color conversion pattern may be negatively tapered.

BRIEF DESCRIPTION OF THE SEVERAL VIEWS OF THE DRAWINGS

The accompanying drawings, which are included to provide a further understanding of various embodiments of the present disclosure and are incorporated in and constitute a part of this application, illustrate embodiment(s) of the present disclosure and together with the description serve to explain the principles of the present disclosure.

In the drawings:

FIGS. 3A to 5A and 3B to 5B are views respectively showing a display device according to another embodiment of the present disclosure;

FIGS. 6A to 11A and 6B to 11B are views sequentially showing a method of forming the display device according to the embodiment of the present disclosure;

DETAILED DESCRIPTION

Figure 1:
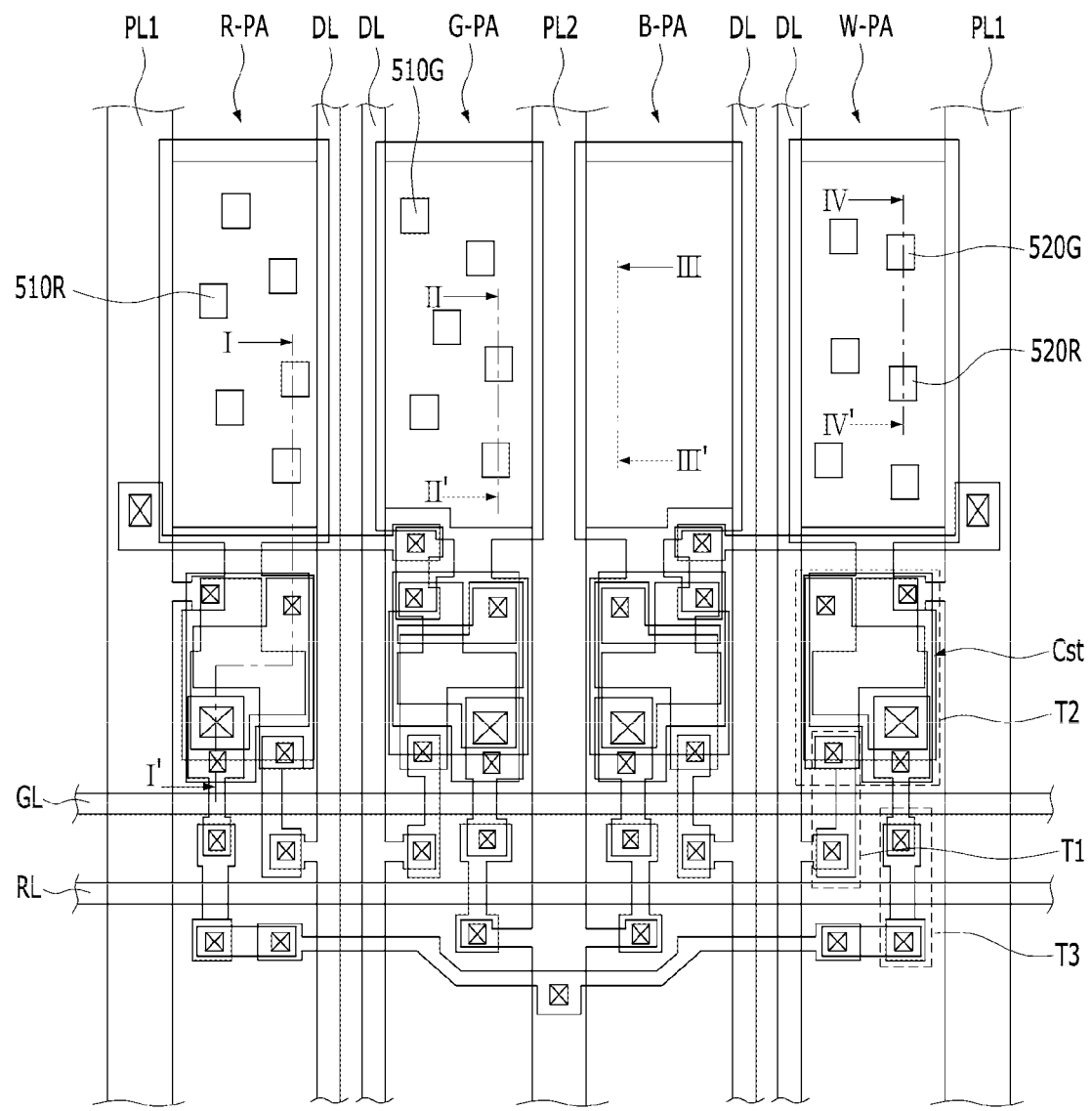
FIG. 1 is a view schematically showing a display device according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the various embodiments of the present disclosure are provided in order to allow the technical sprit of the embodiments to be satisfactorily transferred to those skilled in the art, and thus aspects of the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form may include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2A:
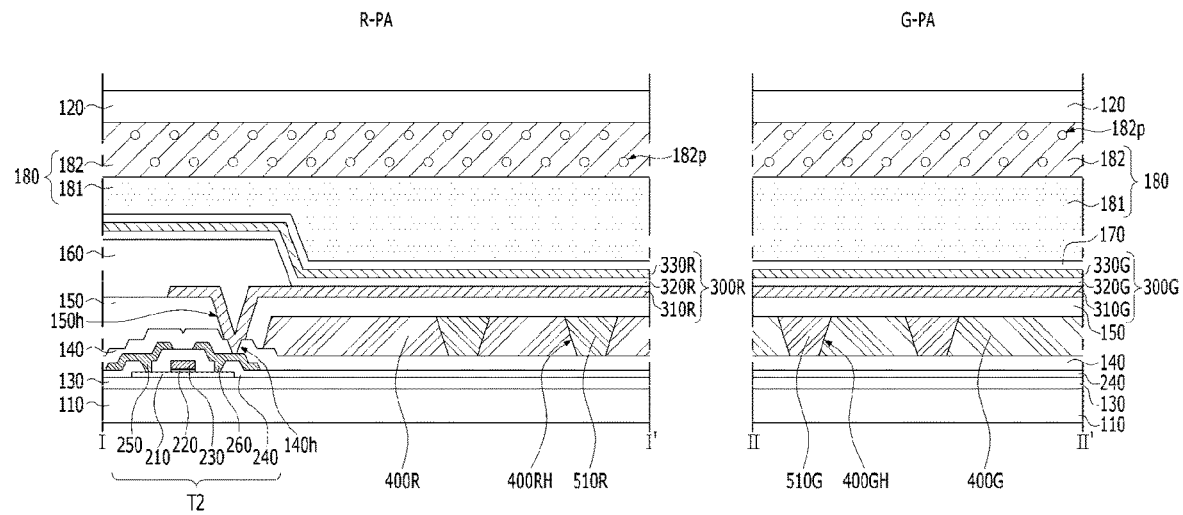
FIG. 2A is a view taken along I-I' and II-IF of FIG. 1.
Figure 2B:
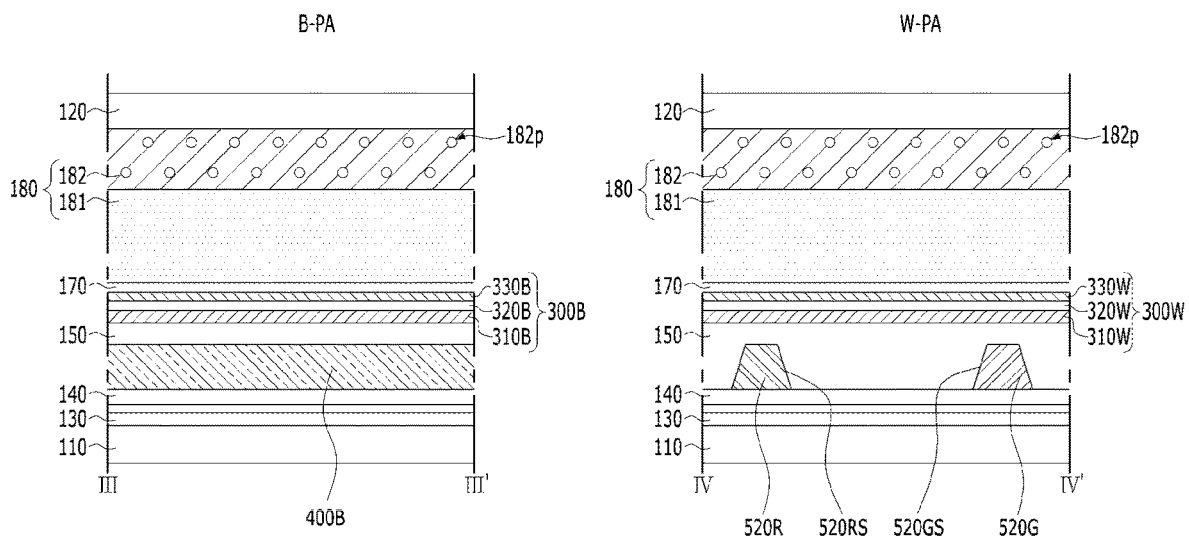
FIG. 2B is a view taken along and IV-IV' of FIG. 1.

FIG. 1 is a view showing a display device according to an embodiment of the present disclosure. FIG. 2A is a view taken along I-I' and II-IF of FIG. 1. FIG. 2B is a view taken along and IV-IV' of FIG. 1.

Referring FIGS. 1, 2A and 2B, the display device according to the embodiment of the present disclosure may include a lower substrate 110. The lower substrate 110 may include an insulating material. The lower substrate 110 may include a transparent material. For example, the lower substrate 110 may glass or plastic.

The lower substrate 110 may include pixel regions R-PA, G-PA, B-PA and W-PA. Each of the pixel regions R-PA, G-PA, B-PA and W-PA may realize or implement a color different from adjacent pixel regions R-PA, G-PA, B-PA and W-PA. For example, the lower substrate 110 may include a red pixel region R-PA, a green pixel region G-PA, a blue pixel region B-PA, and a white pixel region W-PA, which are disposed side by side.

The display device according to the embodiment of the present disclosure is described that each of the pixel regions R-PA, G-PA, B-PA and W-PA has the same size. However, the display device according to another embodiment of the present disclosure may include the pixel regions R-PA, G-PA, B-PA and W-PA having one or more different sizes. For example, in the display device according to another embodiment of the present disclosure, an area of the red pixel region R-PA and an area of the green pixel region G-PA may be smaller than an area of the blue pixel region B-PA and an area of the white pixel region W-PA.

An upper substrate 120 may be disposed on the lower substrate 110. The upper substrate 120 may overlap the pixel regions R-PA, G-PA, B-PA and W-PA of the lower substrate 110. For example, the upper substrate 120 may overlap the red pixel region R-PA, the green pixel region G-PA, the blue pixel region B-PA and the white pixel region W-PA of the lower substrate 110.

In one embodiment the upper substrate 120 includes a material different from the lower substrate 110. In one embodiment, the upper substrate 120 includes a material having a hardness of at least a certain level. For example, the upper substrate 120 may include a metal, such as aluminum (Al), iron (Fe) and nickel (Ni).

A gate line GL, a data line DL, and a power supply line PL1 may be disposed between the lower substrate 110 and the upper substrate 120. For example, the gate line GL, the data line DL, and the power supply line PL1 may be disposed on an upper surface of the lower substrate 110 facing the upper substrate 120; and the upper substrate 120 may be disposed on the gate line GL, the data line DL, and the power supply line PL1.

The gate line GL may be extended in a direction. The data line DL may intersect (i.e., cross over) the gate line GL. The power supply line PL1 may be substantially parallel with the data line DL. The gate line GL, the data line DL, and the power supply line PL1 may be disposed between the adjacent pixel regions R-PA, G-PA, B-PA and W-PA. For example, the pixel regions R-PA, G-PA, B-PA and W-PA may be defined or partially enclosed by the gate line GL, the data line DL, and the power supply line PL1. The gate line GL, the data line DL, and the power supply line PL1 may surround each pixel region R-PA, G-PA, B-PA and W-PA.

A driving circuit may be disposed in each pixel region R-PA, G-PA, B-PA and W-PA. For example, the driving circuit of each pixel region R-PA, G-PA, B-PA and W-PA may include a first thin film transistor T1, a second thin film transistor T2 and a storage capacitor Cst.

The second thin film transistor T2 may have a structure same as the first thin film transistor T1. For example, the first thin film transistor T1 and the second thin film transistor T2 may include a semiconductor pattern 210, a gate insulating layer 220, a gate electrode 230, an interlayer insulating layer 240, a source electrode 250, and a drain electrode 260, respectively.

The semiconductor pattern 210 may be disposed close or adjacent to the lower substrate 110. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The conductivity rate of the channel region may be lower than the conductivity rates of the source region and the drain region. For example, the source region and the drain region may include a conductive impurity.

The gate insulating layer 220 may be disposed on the semiconductor pattern 210. The gate insulating layer 220 may partially cover an upper surface of the semiconductor pattern 210 opposite to the lower substrate 110. For example, the gate insulating layer 220 may overlap the channel region of the semiconductor pattern 210.

The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer 220 may have a multi-layer structure.

The gate electrode 230 may be disposed on the gate insulating layer 220. The gate electrode 230 may be insulated and/or separated from the semiconductor pattern 210 by the gate insulating layer 220. For example, the gate electrode 230 may overlap the channel region of the semiconductor pattern 210.

The gate electrode 230 may include a conductive material. For example, the gate electrode 230 may include a metal, such as aluminum (Al), chrome (Cr), copper (Cu), titanium (Ti), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, the interlayer insulating layer 240 of the second thin film transistor T2 may be coupled to the interlayer insulating layer 240 of the first thin film transistor T1.

The interlayer insulating layer 240 may include an insulating material. For example, the interlayer insulating layer 240 may include silicon oxide.

The source electrode 250 and the drain electrode 260 may be disposed on the interlayer insulating layer 240. The source electrode 250 may be electrically coupled to the source region of the semiconductor pattern 210. The drain electrode 260 may be electrically coupled to the drain region of the semiconductor pattern 210. The drain electrode 260 may be spaced away from the source electrode 250. For example, the interlayer insulating layer 240 may include a contact hole exposing the source region of the semiconductor pattern 210, and a contact hole exposing the drain region of the semiconductor pattern 210.

The source electrode 250 and the drain electrode 260 may include a conductive material. For example, the source electrode 250 and the drain electrode 260 may include a metal, such as aluminum (Al), chrome (Cr), copper (Cu), titanium (Ti), molybdenum (Mo) and tungsten (W), respectively. In one embodiment, the drain electrode 260 includes a material same as the source electrode 250. In one embodiment, the gate electrode 230 includes a material different from the source electrode 250 and the drain electrode 260.

The first thin film transistor T1 may be controlled by a gate signal applied through the gate line GL. For example, the gate electrode 230 of the first thin film transistor T1 may be a part of the gate line GL. The gate electrode 230 of the second thin film transistor T2 may be electrically coupled to the first thin film transistor T1. For example, the first thin film transistor T1 may transmit a data signal applied through the data line DL to the gate line 230 of the second thin film transistor T2 according to the gate signal. The second thin film transistor T2 may generate a driving current according to the data signal. The storage capacitor Cst may maintain the operation of the second thin film transistor T2 for one frame.

A buffer layer 130 may be disposed between the lower substrate 110 and the driving circuits. The buffer layer 130 may be extended beyond the driving circuits. For example, the buffer layer 130 may be disposed between the lower substrate 110 and the first thin film transistor T1, and may be extended between the lower substrate 110 and the second thin film transistor T2.

The buffer layer 130 may include an insulating material. For example, the buffer layer 130 may include silicon oxide.

A reset power line PL2 and a reset line RL may be disposed on the upper surface of the lower substrate 110. The reset power line PL2 may be parallel with the power supply line PL1. The reset line RL may be parallel with the gate line GL. Each of the driving circuits may include a third thin film transistor T3. The third thin film transistor T3 may be controlled by a reset signal applied through the reset line RL. For example, a gate electrode of the third thin film transistor T3 may be a part of the reset line RL. The storage capacitor Cst may be reset by the third thin film transistor T3. For example, the third thin film transistor T3 may electrically couple the storage capacitor Cst to the reset power line PL2 according to the reset signal.

A lower passivation layer 140 may be disposed on the driving circuits. The lower passivation layer 140 may be disposed between the lower substrate 110 and the upper substrate 120. For example, the first thin film transistor T1 and the second thin film transistor T2 may be at least partially covered by the lower passivation layer 140. The lower passivation layer 140 may prevent damage of the driving circuits due to the external impact and moisture. The lower passivation layer 140 may be extended beyond the driving circuits.

The lower passivation layer 140 may include an insulating material. For example, the lower passivation layer 140 may include silicon oxide and/or silicon nitride. The lower passivation layer 140 may have a multi-layer structure.

An over-coat layer 150 may be disposed between the lower passivation layer 140 and the upper substrate 120. The over-coat layer 150 may remove a thickness difference due to the driving circuits. For example, an upper surface of the over-coat layer 150 facing the upper substrate 120 may be flat surface. The upper surface of the over-coat layer 150 may be parallel with the upper surface of the lower substrate 110.

The over-coat layer 150 may include an insulating material. The over-coat layer 150 may include a material different from the lower passivation layer 140. For example, the over-coat layer 150 may include an organic insulating material.

Light-emitting structures 300R, 300G, 300B and 300W may be disposed between the over-coat layer 150 and the upper substrate 120. The light-emitting structures 300R, 300G, 300B and 300W may generate light realizing a specific color, respectively. For example, each of the light-emitting structures 300R, 300G, 300B and 300W may include a lower electrode 310R, 310G, 310B and 310W, a light-emitting layer 320R, 320G, 320B and 320W, and an upper electrode 330R, 330G, 330B and 330W, which are sequentially stacked.

The lower electrode 310R, 310G, 310B and 310W may include a conductive material. The lower electrode 310R, 310G, 310B and 310W may include a transparent material. For example, the lower electrode 310R, 310G, 310B and 310W may be a transparent electrode formed of ITO and/or IZO.

The light-emitting layer 320R, 320G, 320B and 320W may generate light having luminance corresponding to a voltage difference between the lower electrode 310R, 310G, 310B and 310W, and the upper electrode 330R, 330G, 330B and 330W. For example, the light-emitting layer 320R, 320G, 320B and 320W may include an emission material layer (EML) having an emission material. The emission material may be an organic material, an inorganic material and a hybrid material. For example, the display device according to the embodiment of the present disclosure may be an organic light-emitting display device including the light-emitting layer 320R, 320G, 320B and 320W formed of an organic material.

In order to increase luminous efficacy, the light-emitting layer 320R, 320G, 320B and 320W may have a multi-layer structure. For example, the light-emitting layer 320R, 320G, 320B and 320W may further include at least one of a hole injection layer (HIL), a hole transporting layer (HTL), an election transporting layer (ETL), and an electron injection layer (EIL).

The upper electrode 330R, 330G, 330B and 330W may include a conductive material. The upper electrode 330R, 330G, 330B and 330W may include a material different from the lower electrode 310R, 310G, 310B and 310W. For example, the upper electrode 330R, 330G, 330B and 330W may include a metal having high reflectance. Thus, in the display device according to the embodiment of the present disclosure, the light generated by the light-emitting layer 320R, 320G, 320B and 320W may be emitted through the lower substrate 110.

The light-emitting structures 300R, 300G, 300B and 300W may overlap the pixel regions R-PA, G-PA, B-PA and W-PA. For example, the light-emitting structures 300R, 300G, 300B, and 300W may include a red light-emitting structure 300R overlapping with the red pixel region R-PA, a green light-emitting structure 300G overlapping with the green pixel region G-PA, a blue light-emitting structure 300B overlapping with the blue pixel region B-PA, and a white light-emitting structure 300W overlapping with the white pixel region W-PA.

Each of the light-emitting structures 300R, 300G, 300B and 300W may be controlled by the driving circuit disposed in the corresponding pixel region R-PA, G-PA, B-PA and W-PA. For example, the lower electrode 310R, 310G, 310B and 310W of each light-emitting structure 300R, 300G, 300B and 300W may be electrically coupled to the drain electrode 260 of the second thin film transistor T2 disposed in the corresponding pixel region R-PA, G-PA, B-PA and W-PA. Each of the lower passivation layer 140 and the over-coat layer 150 may include contact holes 140h and 150h exposing the drain electrode 260 of the second thin film transistor T2 disposed in each pixel region R-PA, G-PA, B-PA and W-PA.

Each of the light-emitting structures 300R, 300G, 300B and 300W may not overlap the driving circuit disposed in the corresponding pixel region R-PA, G-PA, B-PA and W-PA. For example, the lower electrode 310R, 310G, 310B and 310W of each light-emitting structure 300R, 300G, 300B and 300W may be extended beyond the corresponding driving circuit. Thus, in the display device according to the embodiment of the present disclosure, the light generated by the light-emitting structures 300R, 300G, 300B and 300W may be not blocked by the driving circuits.

The light-emitting structures 300R, 300G, 300B and 300W may be controlled, independently. For example, the lower electrode 310R, 310G, 310B and 310W of each light-emitting structure 300R, 300G, 300B and 300W may be insulated from the lower electrodes 310R, 310G, 310B and 310W of adjacent light-emitting structures 300R, 300G, 300B and 300W. Each of the lower electrodes 310R, 310G, 310B and 310W may be spaced away from adjacent lower electrodes 310R, 310G, 310B and 310W.

The adjacent lower electrodes 310R, 310G, 310B and 310W may be insulated by a bank insulating layer 160. For example, a space between the adjacent lower electrodes 310R, 310G, 310B and 310W may be filled by the bank insulating layer 160. The bank insulating layer 160 may cover an edge of each lower electrode 310R, 310G, 310B and 310W. For example, the bank insulating layer 160 may overlap the driving circuit disposed in each pixel region R-PA, G-PA, B-PA and W-PA.

The bank insulating layer 160 may include an insulating material. For example, the bank insulating layer 160 may include an organic insulating material. The bank insulating layer 160 may include a material different from the over-coat layer 150.

Each of the light-emitting structures 300R, 300G, 300B and 300W may realize or implement a color same as adjacent light-emitting structures 300R, 300G, 300B and 300W. For example, the red light-emitting structure 300R, the green light-emitting structure 300G, the blue light-emitting structure 300B, and the white light-emitting structure 300W may realize or implement white color. The light-emitting layer 320R, 320G, 320B and 320W of each light-emitting structure 300R, 300G, 300B and 300W may be coupled to the light-emitting layer 320R, 320G, 320B and 320W of adjacent light-emitting structure 300R, 300G, 300B and 300W. For example, the light-emitting layer 320R, 320G, 320B and 320W of each light-emitting structure 300R, 300G, 300B and 300W may be extended on the bank insulating layer 160. The upper electrode 330R, 330G, 330B and 330W of each light-emitting structure 300R, 300G, 300B and 300W may be extended along the light-emitting layer 320R, 320G, 320B and 320W of the corresponding light-emitting structure 300R, 300G, 300B and 300W. For example, the upper electrode 330R, 330G, 330B and 330W of each light-emitting structure 300R, 300G, 300B and 300W may be coupled to the upper electrode 330R, 330G, 330B and 330W of adjacent light-emitting structure 300R, 300G, 300B and 300W.

Color filters 400R, 400G and 400B may be disposed between the lower substrate 110 and the light emitting structures 300R, 300G, 300B and 300W. The color filters 400R, 400G and 400B may realize or implement a specific color by partially absorbing and/or blocking a light generated by the light-emitting structures 300R, 300G, 300B and 300W. The color filters 400R, 400G and 400B may overlap the corresponding light-emitting structure 300R, 300G, 300B and 300W. For example, the color filters 400R, 400G, 400B may include a red color filter 400R disposed between the red pixel area R-PA of the lower substrate 110 and the red light-emitting structure 300R, a green color filter 400G disposed between the green pixel area G-PA of the lower substrate 110 and the green light-emitting structure 300G, and a blue color filter 400B disposed between the blue pixel area B-PA of the lower substrate 110 and the blue light-emitting structure 300B. Since the light-emitting structures 300R, 300G, 300B and 300W realize white color, the color filter 400R, 400G, 400B may be not disposed on the white pixel area W-PA of the lower substrate 110.

The red color filter 400R may realize red color by using the light generated by the red light-emitting structure 300R. For example, the red color filter 400R may be disposed between the lower passivation layer 140 and the over-coat layer 150. The thickness difference due to the red color filter 400R may be removed by the over-coat layer 150. The red color filter 400R may overlap a portion of the red lower electrode 310R of the red light-emitting structure 300R exposed by the bank insulating layer 160. For example, the red color filter 400R may be spaced away from the driving circuit in the red pixel area R-PA of the lower substrate 110.

The red color filter 400R may include at least one red penetrating hole 400RH. In one embodiment, the red penetrating hole 400RH is a through hole that extends through opposite surfaces of the red color filter 400R. The red penetrating hole 400RH may be formed by a process of patterning the red color filter 400R. In one embodiment, a side of the red penetrating hole 400RH is negatively tapered (e.g., sidewalls of the red penetrating hole 400RH extend towards each other as the sidewalls approach the lower substrate 110).

A first red color conversion pattern 510R may be disposed in the red penetrating hole 400Rh of the red color filter 400R. In one embodiment, the first red color conversion pattern 510R completely fills the red penetrating hole 400RH of the red color filter 400R. In one embodiment, a thickness of the first red color conversion pattern 510R is substantially the same as a thickness of the red color filter 400R such that upper and lower surfaces of the first red color conversion pattern 510R are substantially coplanar with upper and lower surfaces, respectively, of the first red color conversion patter 510R. The first red color conversion pattern 510R may be surrounded by the red color filter 400R.

The red penetrating hole 400RH may be disposed outside the driving circuit in the red pixel area R-PA of the lower substrate 110. For example, the first red color conversion pattern 510R may be spaced away from the driving circuit disposed in the red pixel area R-PA of the lower substrate 110.

The first red color conversion pattern 510R may overlap the red light-emitting structure 300R. The first red color conversion pattern 510R may realize red color using the light generated by the red light-emitting structure 300R. For example, the first red color conversion pattern 510R may convert light which is generated by the red light-emitting structure 300R and has a wavelength shorter than a wavelength of red, to light having a wavelength of red.

The display device according to the embodiment of the present disclosure may include the first red color conversion pattern 510R disposed side by side (i.e., lateral) with the red color filter 400R on the red pixel area R-PA of the lower substrate 110. Thus, in the display device according to the embodiment of the present disclosure, red color realized by the red color filter 400R and red color realized by the first red color conversion pattern 510R may be emitted on the red pixel area R-PA of the lower substrate 110, simultaneously. That is, in the display device according to the embodiment of the present disclosure, luminescence and efficient of red color realized in the red pixel area R-PA of the lower substrate 110 may be increased. Therefore, in the display device according to the embodiment of the present disclosure, the color gamut of red color may be improved.

A side surface of the first red color conversion pattern 510R may be tapered in a direction same as the side surface of the red penetrating hole 400RH. For example, the side surface of the first red color conversion pattern 510R may be tapered in a direction opposite to a side surface of the red color filter 400R. The side surface of the first red color conversion pattern 510R may be negatively tapered.

The number of the first red color conversion pattern 510R may be same as the number of the red penetrating hole 400RH of the red color filter 400R. Thus, in the display device according to the embodiment of the present disclosure, the relative area of the first red color conversion pattern 510R may be adjusted by the number and the size of the red penetrating hole 400RH in the red color filter 400R. Therefore, in the display device according to the embodiment of the present disclosure, the characteristic of red color realized in the red pixel area R-PA of the lower substrate 110 may be easily adjusted.

The green color filter 400G may realize green color by using the light generated by the green light-emitting structure 300G. For example, the green color filter 400G may be disposed between the lower passivation layer 140 and the over-coat layer 150. The thickness difference due to the green color filter 400G may be removed or reduced by the over-coat layer 150. The green color filter 400G may overlap a portion of the green lower electrode 310G of the green light-emitting structure 300G exposed by the bank insulating layer 160. For example, the green color filter 400G may include a portion disposed outside the driving circuit in the green pixel area G-PA of the lower substrate 110.

The green color filter 400G may include at least one green penetrating hole 400GH. The green penetrating hole 400GH may be formed by a process of patterning the green color filter 400G. For example, a side surface of the green color filter 400G facing the green penetrating hole 400GH may be positively tapered (e.g., a side surface of the green color filter 400G extends towards the a first green color conversion pattern 510G as the side surface approaches the lower substrate 110).

A first green color conversion pattern 510G may be disposed in the green penetrating hole 400GH of the green color filter 400G. Similar to the first red color conversion pattern 510R, the first green color conversion pattern 510G may completely fill the green penetrating hole 400GH of the green color filter 400G. For example, a thickness of the first green color conversion pattern 510G may be substantially the same as a thickness of the green color filter 400G. The first green color conversion pattern 510G may be surrounded by the green color filter 400G.

The green penetrating hole 400GH may be disposed outside the driving circuit in the green pixel area G-PA of the lower substrate 110. For example, the first green color conversion pattern 510G may be spaced away from the driving circuit in the green pixel area G-PA of the lower substrate 110.

The first green color conversion pattern 510G may overlap the green light-emitting structure 300G. The first green color conversion pattern 510G may realize green color using the light generated by the green light-emitting structure 300G. For example, the first green color conversion pattern 510G may convert the light which is generated by the green light-emitting structure 300G and has a wavelength shorter than the light having a wavelength of green, to the light having a wavelength of the green.

The display device according to the embodiment of the present disclosure may include the first green color conversion pattern 510G disposed side by side with the green color filter 400G on the green pixel area G-PA of the lower substrate 110. Thus, in the display device according to the embodiment of the present disclosure, green color realized by the green color filter 400G and green color realized by the first green color conversion pattern 510G may be emitted on the green pixel area G-PA of the lower substrate 110, simultaneously. That is, in the display device according to the embodiment of the present disclosure, the luminescence and the efficient of green color realized in the green pixel area G-PA of the lower substrate 110 may be increased. Therefore, in the display device according to the embodiment of the present disclosure, the color gamut for green color may be improved.

A side surface of the first green color conversion pattern 510G may be tapered in a direction same as a side surface of the green penetrating hole 400GH. For example, the side surface of the first green color conversion pattern 510G may be tapered in a direction opposite to the side surface of the green color filter 400G. The side surface of the first green color conversion pattern 510G may be negatively tapered.

The number of the first green color conversion pattern 510G may be the same as the number of the green penetrating hole 400GH. Thus, in the display device according to the embodiment of the present disclosure, the relative area of the first green color conversion pattern 510G may be adjusted by the number and the size of the green penetrating hole 400GH in the green color filter 400G. Therefore, in the display device according to the present disclosure, the characteristic of green color realized in the green pixel area G-PA of the lower substrate 110 may be easily adjusted.

The number of the green color conversion pattern 510G may be different from the number of the red color conversion pattern 510R. Thus, in the display device according to the embodiment of the present disclosure, the characteristic of red color realized in the red pixel area R-PA and the characteristic of green color realized in the green pixel area G-PA 110 may be adjusted, independently.

The blue color filter 400B may realize blue color using the light generated by the blue light-emitting structure 300B. For example, the blue color filter 400B may be disposed between the lower passivation layer 140 and the over-coat layer 150. The thickness difference due to the blue color filter 400B may be removed by the over-coat layer 150. The blue color filter 400B may overlap a portion of the lower electrode 310B of the blue light-emitting structure 300B exposed by the bank insulating layer 160. For example, the blue color filter 400B may include a portion disposed outside the driving circuit in the blue pixel area B-PA of the lower substrate 110.

At least one second red color conversion pattern 520R may be disposed on the white pixel area W-PA of the lower substrate 110. The second red color conversion pattern 520R may overlap the white light-emitting structure 300W. The second red color conversion pattern 520R may include a material same as the first red color conversion pattern 510R. For example, the second red color conversion pattern 520R may realize red color using light generated by the white light-emitting structure 300B. The second red color conversion pattern 520R may be spaced away from the driving circuit disposed in the white pixel area W-PA of the lower substrate 110.

The second red color conversion pattern 520R may be disposed on a layer same as the first red color conversion pattern 510R. For example, the second red color conversion pattern 520R may be disposed between the lower passivation layer 140 and the over-coat layer 150. The thickness difference due to the second red color conversion pattern 520R may be removed by the over-coat layer 150.

A thickness of the second red color conversion pattern 520R may be same as the thickness of the first red color conversion pattern 510R. For example, an upper surface of the second red color conversion pattern 520R facing the upper substrate 120 may be coplanar with an upper surface of the first red color conversion pattern 510R facing the upper substrate 120.

At least one second green color conversion pattern 520G may be disposed on the white pixel area W-PA of the lower substrate 110. The second green color conversion pattern 520G may overlap the white light-emitting structure 300W. The second green color conversion pattern 520G may include a material same as the first green color conversion pattern 510G. For example, the second green color conversion pattern 520G may realize green color using light generated by the white light-emitting structure 300W. The second green color conversion pattern 520G may be spaced away from the driving circuit in the white pixel area W-PA of the lower substrate 110. For example, the second green color conversion pattern 520G may be spaced away from the second red color conversion pattern 520R.

The second green color conversion pattern 520G may be disposed on a layer same as the first green color conversion pattern 510G. For example, the second green color conversion pattern 520G may be disposed between the lower passivation layer 140 and the over-coat layer 150. The thickness difference due to the second green color conversion pattern 520G may be removed by the over-coat layer 150.

A thickness of the second green color conversion pattern 520G may be same as the thickness of the first green color conversion pattern 510G. For example, an upper surface of the second green color conversion pattern 520G facing the upper substrate 120 may be coplanar with an upper surface of the first green color conversion pattern 510R facing the upper substrate 120.

The display device according to the embodiment of the present disclosure include at least one second red color conversion pattern 520R and at least one second green color conversion pattern 520G which are disposed between the white pixel are W-PA of the lower substrate 110 and the white light-emitting structure 300B. The number of the second red color conversion pattern 520R may be different from the number of the first red color conversion pattern 510R. The number of the second green color conversion pattern 520G may be different from the number of the first green color conversion pattern 510G. The number of the second green color conversion pattern 520G may be different from the number of the second red color conversion pattern 520R. Thus, in the display device according to the embodiment of the present disclosure, the characteristic of white color realized in the white pixel area W-PA of the lower substrate 110 may be adjusted by the number and the size of the second red color conversion pattern 520R, and the number and the size of the second green color conversion pattern 520G. Therefore, in the display device according to the embodiment of the present disclosure, the color coordinates may be easily adjusted.

A side surface 520GS of the second green color conversion pattern 520G may be tapered in a direction same as a side surface 520RS of the second red color conversion pattern 520R. For example, the side surface 520RS of the second red color conversion pattern 520R and the side surface 520GS of the second green color conversion pattern 520G may be positively tapered. The side surface 520RS of the second red color conversion pattern 520R and the side surface 520GS of the second green color conversion pattern 520G may be tapered in a direction opposite to the side surface of the first red color conversion pattern 510R and the side surface of the first green color conversion pattern 510G.

An upper passivation layer 170 may be disposed between the light-emitting structures 300R, 300G, 300B and 300W, and the upper substrate 120. The upper passivation layer 170 may cover the light-emitting structures 300R, 300G, 300B and 300W. For example, the upper passivation layer 170 may be extended along the upper electrode 330R, 330G, 330B and 330W of each light-emitting structure 300R, 300G, 300B and 300W.

The upper passivation layer 170 may prevent damage of the light-emitting structures 300R, 300G, 300B and 300W due to the external impact and moisture. The upper passivation layer 170 may include an insulating material. The upper passivation layer 170 may have a multi-layer structure. For example, the upper passivation layer 170 may have a structure in which an organic layer formed of an organic material is disclosed between inorganic layers formed of an inorganic material.

An encapsulating layer 180 may be disposed between the upper passivation layer 170 and the upper substrate 120. The upper substrate 120 may be coupled to the lower substrate 110 in which the light-emitting structures 300R, 300G, 300B and 300W are formed, by the encapsulating layer 180. For example, the encapsulating layer 180 may include an adhesive material.

The encapsulating layer 180 may have a multi-layer structure. For example, the encapsulating layer 180 may include a first encapsulating layer 181 and a second encapsulating layer 182. The second encapsulating layer 182 may be disposed between the first encapsulating layer 181 and the upper substrate 120.

The first encapsulating layer 181 and the second encapsulating layer 182 may include a curable material. For example, the first encapsulating layer 181 and the second encapsulating layer 182 may include a thermosetting resin. The second encapsulating layer 182 may include a material different from the first encapsulating layer 181.

The encapsulating layer 180 may prevent the permeation of moisture. For example, the second encapsulating layer 182 may include a moisture-absorbing material 182p. The moisture permeating from the outside may be collected by the moisture-absorbing material 182p. The first encapsulating layer 181 may relieve stress due to the expansion of the moisture-absorbing material 182p.

Accordingly, the display device according to the embodiment of the present disclosure may include at least one first red color conversion pattern 510R disposed side by side with the red color filter 400R in the red pixel area R-PA, and at least one first green color conversion pattern 510G disposed side by side with the green color filter 400G in the green pixel area G-PA, so that decreasing the luminesce and the efficient due to the red color filter 400R and the green color filter 400G may be minimized without increasing the overall thickness of the display device. Thus, in the display device according to the embodiment of the present disclosure, the characteristics of red color realized in the red pixel area R-PA and the characteristics of green color realized in the green pixel area G-PA may be increased. Therefore, in the display device according to the embodiment of the present disclosure, the color gamut may be improved.

Also, the display device according to the embodiment of the present disclosure may include at least one second red color conversion pattern 520R and at least on second green color conversion pattern 520G which are disposed on the white pixel area W-PA of the lower substrate 110. Thus, in the display device according to the embodiment of the present disclosure, the characteristics of color realized in the white pixel area W-PA may be adjusted according to the characteristics of non-white color realized in non-white pixel area R-PA, G-PA and B-PA, by adjusting the number of the color conversion patterns 520R and 520G which are disposed on the white pixel area W-PA of the lower substrate 110. Thereby, in the display device according to the embodiment of the present disclosure, the color coordinates may be easily adjusted.

The display device according to the embodiment of the present disclosure is described that the upper surface of each first color conversion pattern 510R and 510G are substantially coplanar with the upper surface of the corresponding color filter 400R and 400G. However, the display device according to another embodiment of the present disclosure may include the first color conversion patterns 510R and 510G having a thickness different from the corresponding color filter 400R and 400G. For example, in the display device according to another embodiment of the present disclosure, the first color conversion patterns 510R and 510G may at least partially fill the penetrating hole 400RH and 400GH of the corresponding color filter 400R and 400R.

The display device according to the embodiment of the present disclosure is described that the upper surfaces of the first color conversion patterns 510R and 510G facing the upper substrate 120 are in direct contact with the over-coat layer 150. However, the display device according to another embodiment of the present disclosure may include a color conversion layer 530R and 530G which is disposed between the first color conversion pattern 510R and 510G and the over-coat layer 150, and is extended between the corresponding color filter 400R and 400G and the over-coat layer 150, as shown FIGS. 3A and 3B.

The color conversion layer 530R and 530G may be disposed on the red pixel region R-PA and the green pixel region G-PA on which the first color conversion pattern 510R and 510G is disposed. For example, the color conversion layer 530R and 530G may include a red color conversion layer 530R overlapping with the red color filter 400R, and a green color conversion layer 530G overlapping with the green color filter 400G.

The red color conversion layer 530R may realize red color using light generated by the red light-emitting structure 300R. The red color conversion layer 530R may include a material same as the first red color conversion pattern 510R. For example, a boundary between the first red color conversion pattern 510R and the red color conversion layer 530R may be not distinguished from other regions, substantially.

A thickness of the red color conversion layer 530R may be thinner than the thickness of the red color filter 400R. For example, the thickness of the red color conversion layer 530R may be thinner than the thickness of the first red color conversion pattern 510R. The thickness of the second red color conversion pattern 520R on the white pixel area W-PA of the lower substrate 110 may be thicker than the first red color conversion pattern 510R. For example, an upper surface of the second red color conversion pattern 520R facing the upper substrate 120 may be substantially coplanar with an upper surface of the red color conversion layer 530R facing the upper substrate 120.

The green color conversion layer 530G may realize green color using the light generated by the green light-emitting structure 300G. The green color conversion layer 530G may include a material same as the first green color conversion pattern 510G. For example, a boundary between the first green color conversion pattern 510G and the green color conversion layer 530G may be not distinguished from other regions, substantially.

A thickness of the green color conversion layer 530G may be thinner than the thickness of the green color filter 400G. For example, the thickness of the green color conversion layer 530G may be thinner than the thickness of the first green color conversion pattern 510G. The thickness of the second green color conversion pattern 520G on the white pixel area W-PA of the lower substrate 110 may be thicker than the first green color conversion pattern 510G. For example, an upper surface of the second green color conversion pattern 520G facing the upper substrate 120 may be substantially coplanar with an upper surface of the green color conversion layer 530G facing the upper substrate 120.

Accordingly, in the display device according to another embodiment of the present disclosure, the color conversion layer 530R and 530G having a thickness thinner than the corresponding color filter 400R, 400G and 400B may be disposed on the color filter 400R, 400G and 400B, and the first color conversion pattern 510R and 510G. Thus, in the display device according to another embodiment of the present disclosure, increasing overall thickness of the display device may be minimized, and color gamut may be greatly improved.

Figure 4A:
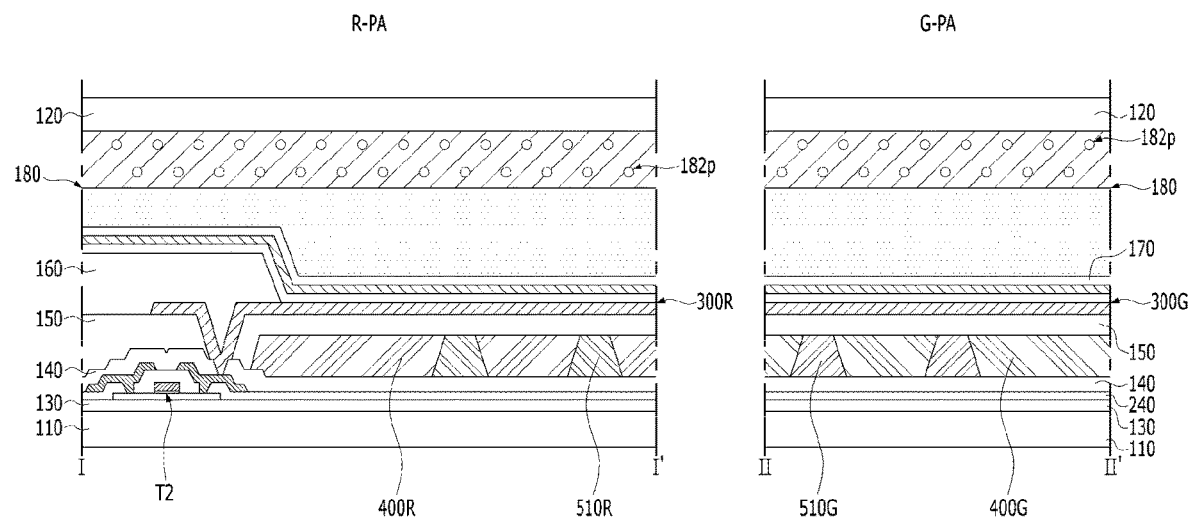
Figure 4B:
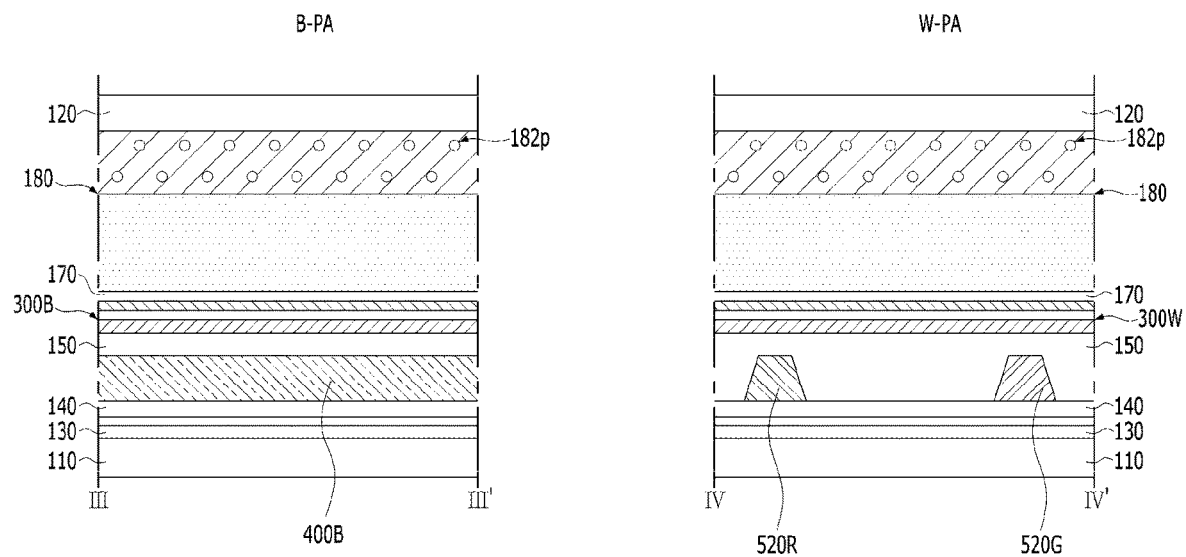

The display device according to the embodiment of the present disclosure is described that the side surface of the first color conversion pattern 510R and 510G is tapered in a direction opposite to the side surface of the corresponding color filter 400R, 400G and 400B. However, the display device according to another embodiment of the present disclosure may include the first color conversion pattern 510R and 510G having a side surface which is positively tapered in a direction same as the side surface of the corresponding color filter 400R, 400G and 400B, as shown in FIGS. 4A and 4B. That is, in the display device according to another embodiment of the present disclosure, the side surface of the first color conversion pattern 510R and 510G may be tapered in a direction same as the side surface of the second color conversion pattern 520R and 520G on the white pixel area W-PA of the lower substrate 110. Thus, in display device according to another embodiment of the present disclosure, the degree of freedom for a process of forming the first color conversion pattern 510R and 510G may be improved.

Figure 5A:
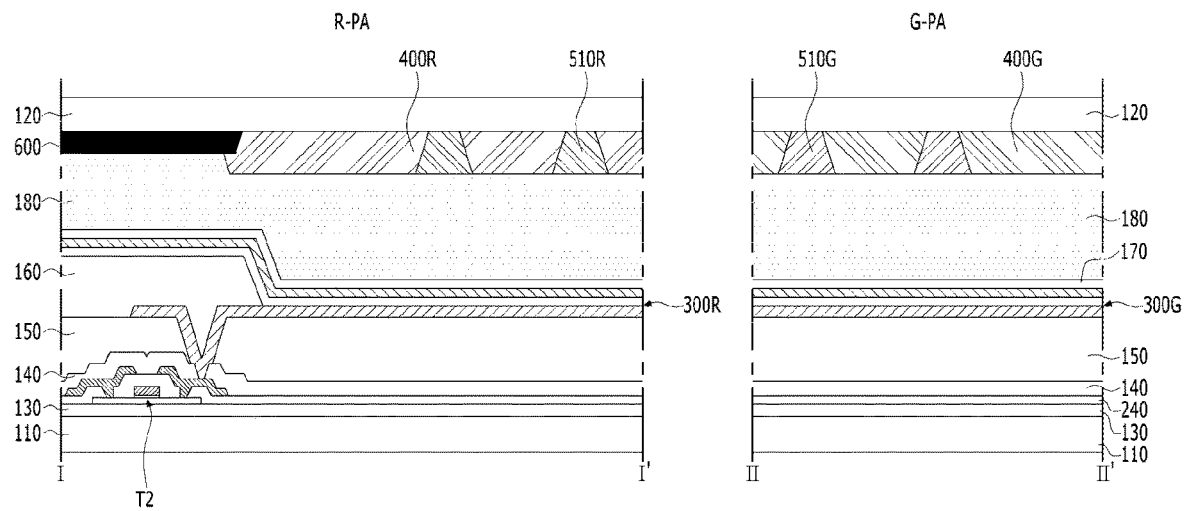
Figure 5B:
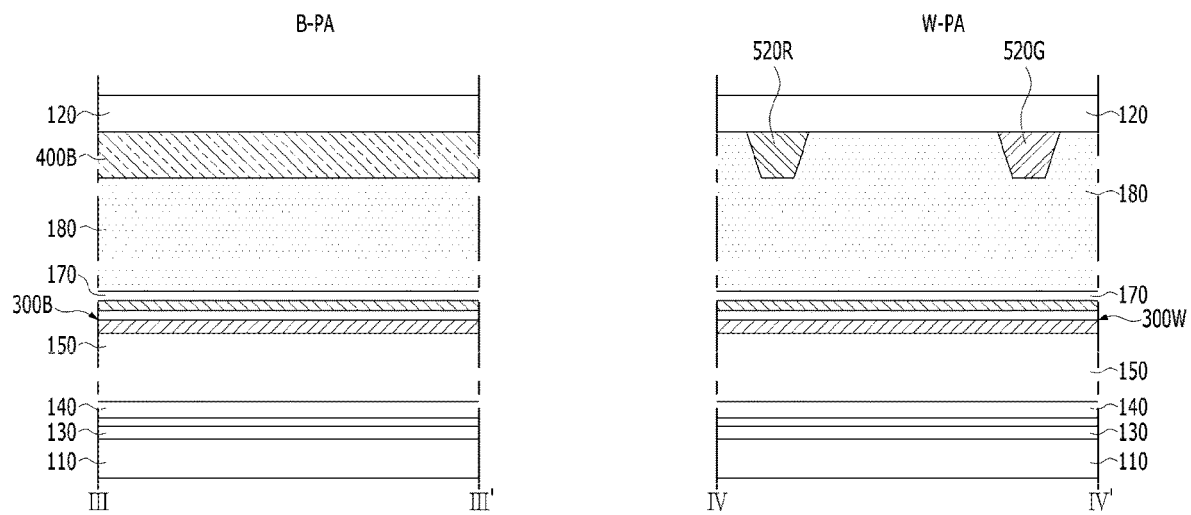

The display device according to the embodiment of the present disclosure is described that the color filters 400R, 400G and 400B, the first color conversion patterns 510R and 510G, and the second color conversion patterns 520R and 520G are disposed between the lower substrate 110 and the light-emitting structures 300R, 300G, 300B and 300W. However, the display device according to another embodiment of the present disclosure may include the color filters 400R, 400G and 400B, the first color conversion patterns 510R and 510G, and the second color conversion patterns 520R and 520G on a lower surface of the upper substrate 120 facing the lower substrate 110, as shown, for example, in FIGS. 5A and 5B. In the display device according to another embodiment of the present disclosure, a black matrix 600 may be disposed on the lower surface of the upper substrate 120. Thus, the display device according to another embodiment of the present disclosure may prevent damage of the driving circuits due to a process of forming the color filters 400R, 400G and 400B, the first color conversion patterns 510R and 510G, and the second color conversion patterns 520R and 520G. Therefore, in the display device according to another embodiment of the present disclosure, the degree of the freedom for a process of forming the color filters 400R, 400G and 400B, the first color conversion patterns 510R and 510G, and the second color conversion patterns 520R and 520G may be greatly increased.

Figure 6A:
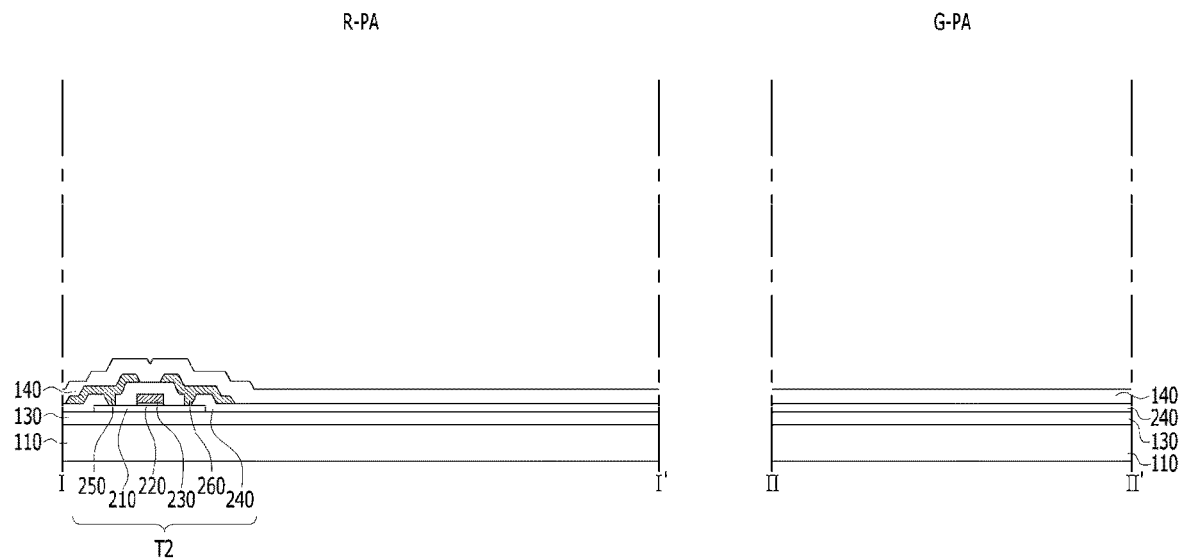
Figure 6B:
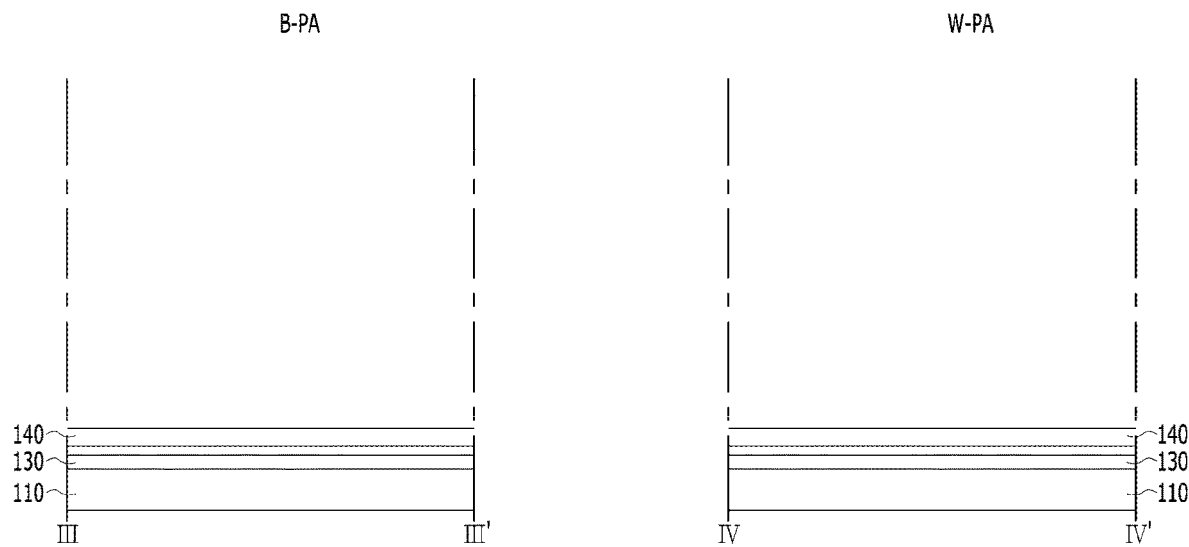

FIGS. 6A to 11A and 6B to 11B are views sequentially showing a method of forming the display device according to the embodiment of the present disclosure. Referring to FIGS. 1, 2A, 2B, 6A to 11A and 6B to 11B, the method of forming the display device according to the embodiment of the present disclosure is described. First, the method of forming the display device according to the embodiment of the present disclosure may include a step of forming driving circuits on a lower substrate 110, and a step of forming a lower passivation layer 140 covering the driving circuits, as shown in FIGS. 6A and 6B.

The step of forming the driving circuits may include a step of preparing the lower substrate 110 including a red pixel area R-PA, a green pixel area G-PA, a blue pixel area B-PA, and a white pixel area W-PA; a step of forming a gate line GL, a data line DL and a power supply line PL1 defining the pixel areas R-PA, G-PA, B-PA and W-PA; and a step of forming the driving circuit including a first thin film transistor T1, a second thin film transistor T2 and a storage capacitor Cst on each pixel area R-PA, G-PA, B-PA and W-PA of the lower substrate 110.

The second thin film transistor T2 may have a structure that is substantially the same as the first thin film transistor T1. For example, the step of forming the first thin film transistor T1 and the second thin film transistor T2 may include a step of forming a semiconductor pattern 210 including a source region, a drain region and a channel region; a step of sequentially stacking a gate insulating layer 220 and a gate electrode 230 on the semiconductor pattern 210; a step of forming an interlayer insulating layer 240 covering the semiconductor pattern 210 and the gate electrode 230; and a step of forming a source electrode 250 electrically connected to the source region of the semiconductor pattern 210 and a drain electrode 160 electrically connected to the drain region of the semiconductor pattern 210 on the interlayer insulating layer 240.

The gate line GL, the data line DL, the power supply line PL1 and the storage capacitor Cst may be formed with the first thin film transistor T1 and the second thin film transistor T2, simultaneously. For example, the gate line GL may be simultaneously formed with the gate electrodes 230 of the first/second thin film transistors T1 and T2. The data line DL and the power supply line PL1 may be simultaneously formed with the source/drain electrodes 250 and 260 of the first/second thin film transistors T1 and T2. The storage capacitor Cst may be formed by using conductive layers constituting the first/second thin film transistors T1 and T2.

Figure 7A:
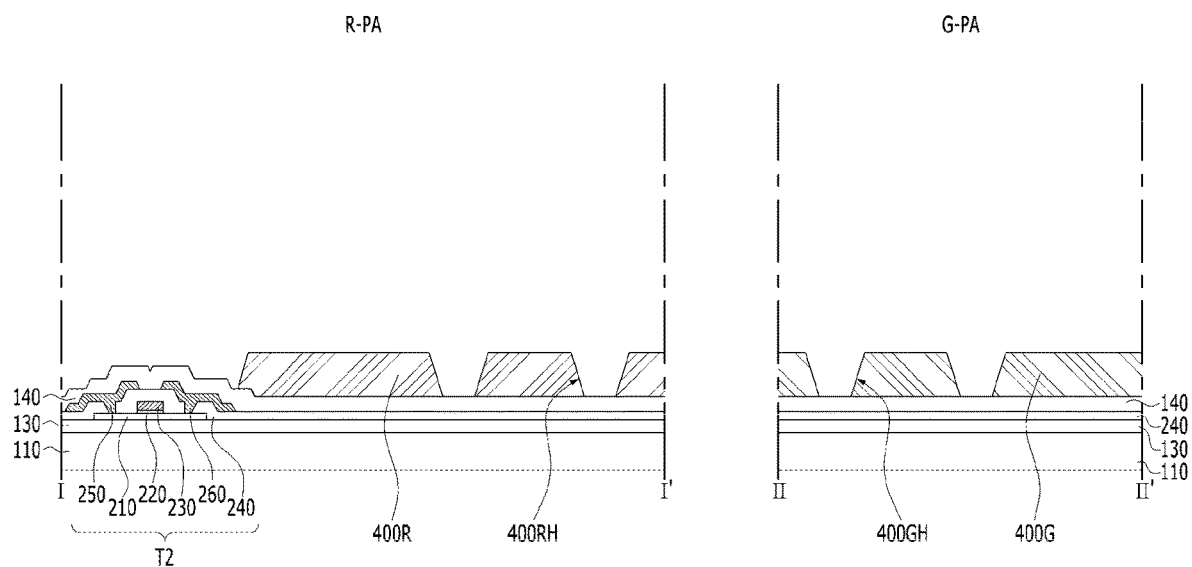
Figure 7B:
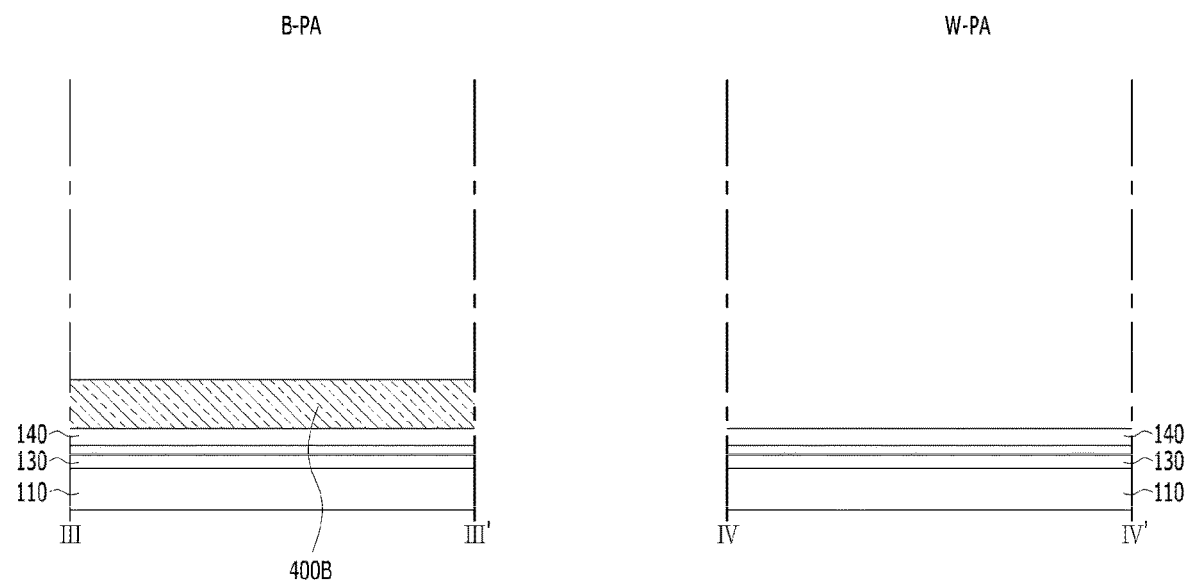

The method of forming the display device according to the embodiment of the present disclosure may include a step of forming color filters 400R, 400G and 400B on the lower passivation layer 140, as shown in FIGS. 7A and 7B.

The step of forming the color filters 400R, 400G and 400B may include a step of forming a red color filter 400R on the red pixel area R-PA of the lower substrate 110, a step of forming a green color filter 400G on the green pixel area G-PA of the lower substrate 110; and a step of forming a blue color filter 400B on the blue pixel area B-PA of the lower substrate 110. The color filters 400R, 400G and 400B may not overlap the driving circuits. For example, the color filters 400R, 400G and 400B may be formed at the outside of the driving circuit of the corresponding pixel area R-PA, G-PA, B-PA and W-PA.

The red color filter 400R may include at least one red penetrating hole 400RH. For example, the step of forming the red color filter 400R may include a step of forming a color filter material layer for the red color filter 400R on the lower substrate 110 on which the driving circuits is formed, and a step of forming the red color filter 400R including at least one the red penetrating hole 400RH on the red pixel area R-PA of the lower substrate 110 by patterning the color filter material layer.

The green color filter 400G may include at least one green penetrating hole 400GH. For example, the step of forming the green color filter 400G may include a step of forming a color filter material layer for the green color filter 400G on the lower substrate 110 on which the driving circuits is formed, and a step of forming the green color filter 400G including at least one the green penetrating hole 400GH on the green pixel area G-PA of the lower substrate 110 by patterning the color filter material layer.

Figure 8A:
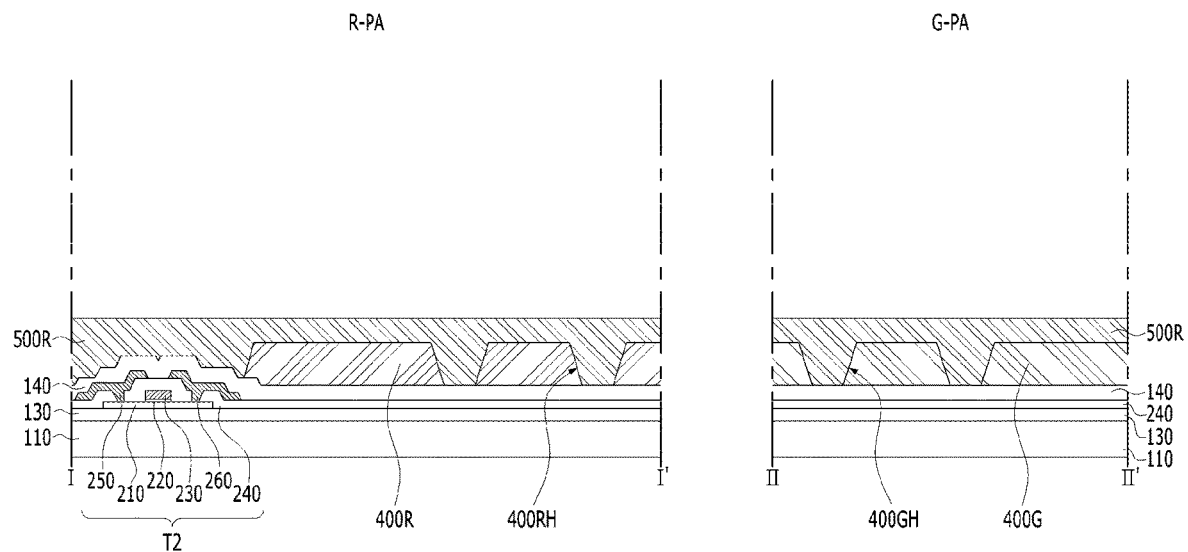
Figure 8B:
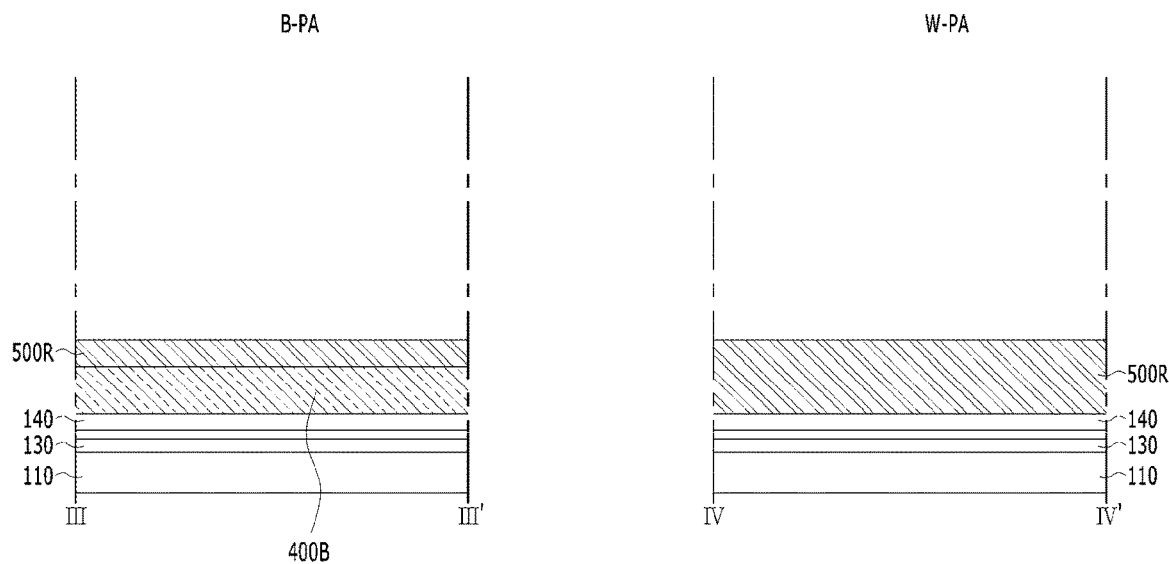

The method of forming the display device according to the embodiment of the present disclosure may include a step of forming a red color conversion material layer 500R on the lower substrate 110 on which the color filters 400R, 400G and 400B are formed, as shown in FIGS. 8A and 8B.

The red color conversion material layer 500R may fill the red penetrating hole 400RH of the red color filter 400R, and the green penetrating hole 400GH of the green color filter 400G. For example, a thickness of the red color conversion material layer 500R may be thicker than thickness of the color filters 400R, 400G and 400B.

Figure 9A:
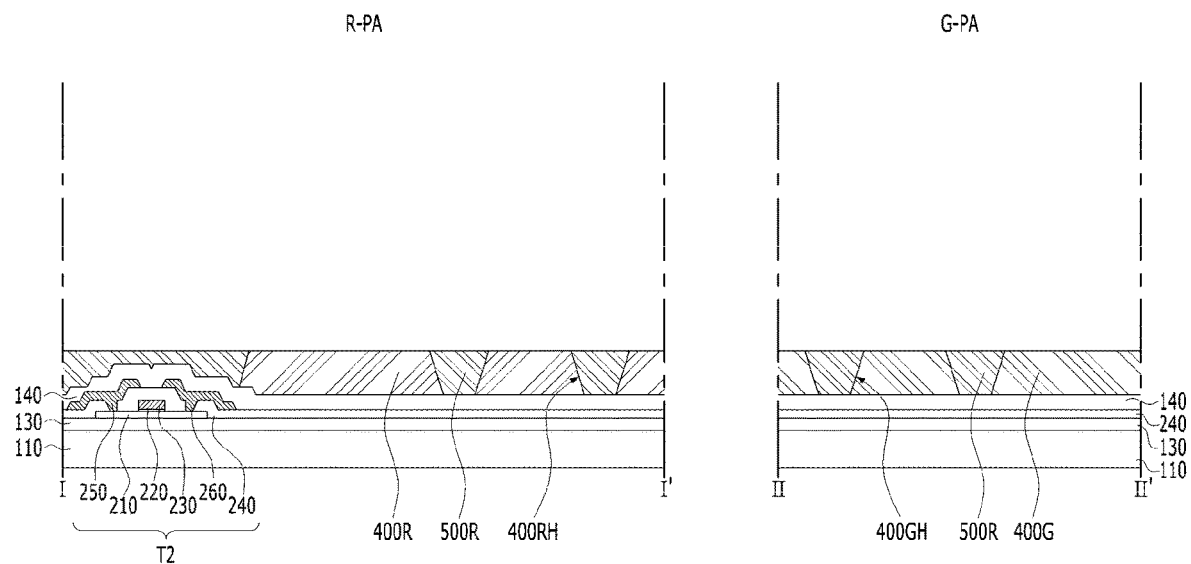
Figure 9B:
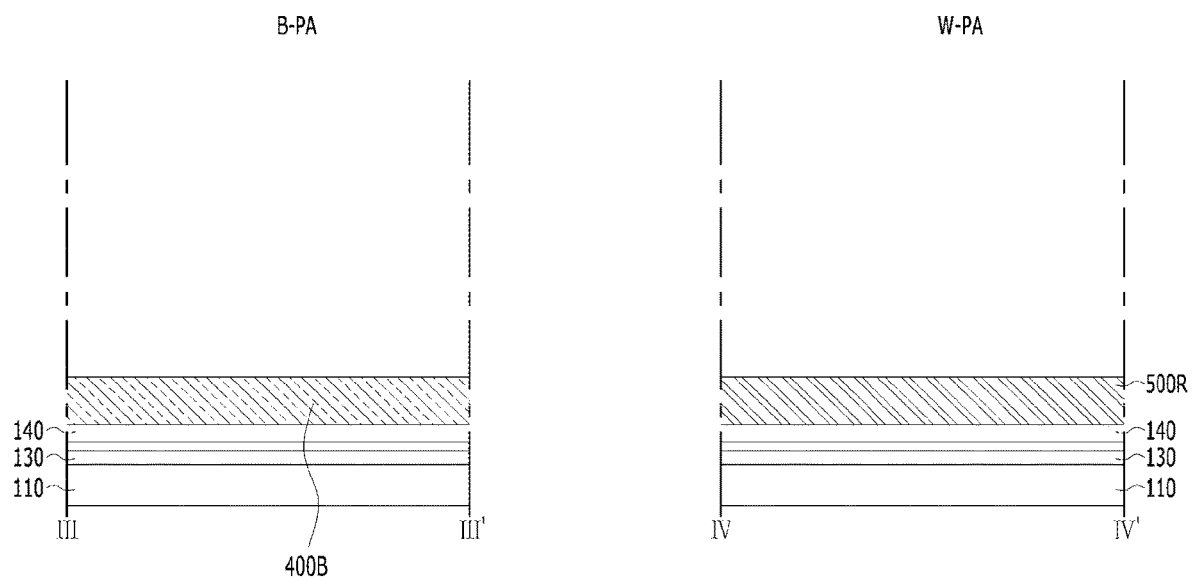

The method of forming the display device according to the embodiment of the present disclosure may include a step of performing etch-back of the red color conversion material layer 500R, such that an upper surface of the color filters 400R, 400G and 400B opposite to the lower substrate 110 may be exposed, as shown in FIGS. 9A and 9B.

Figure 10A:
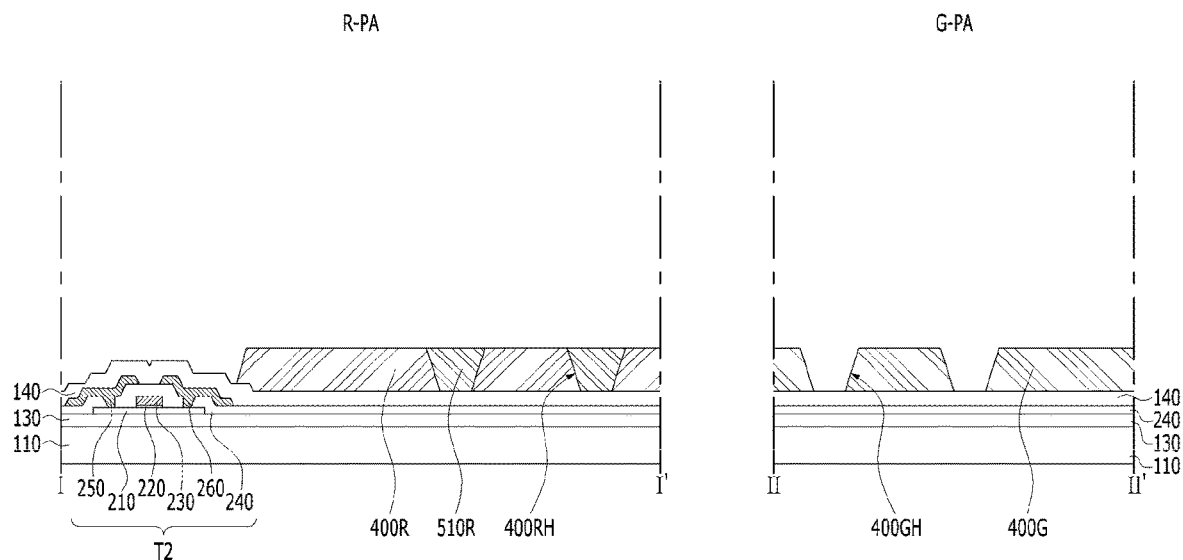
Figure 10B:
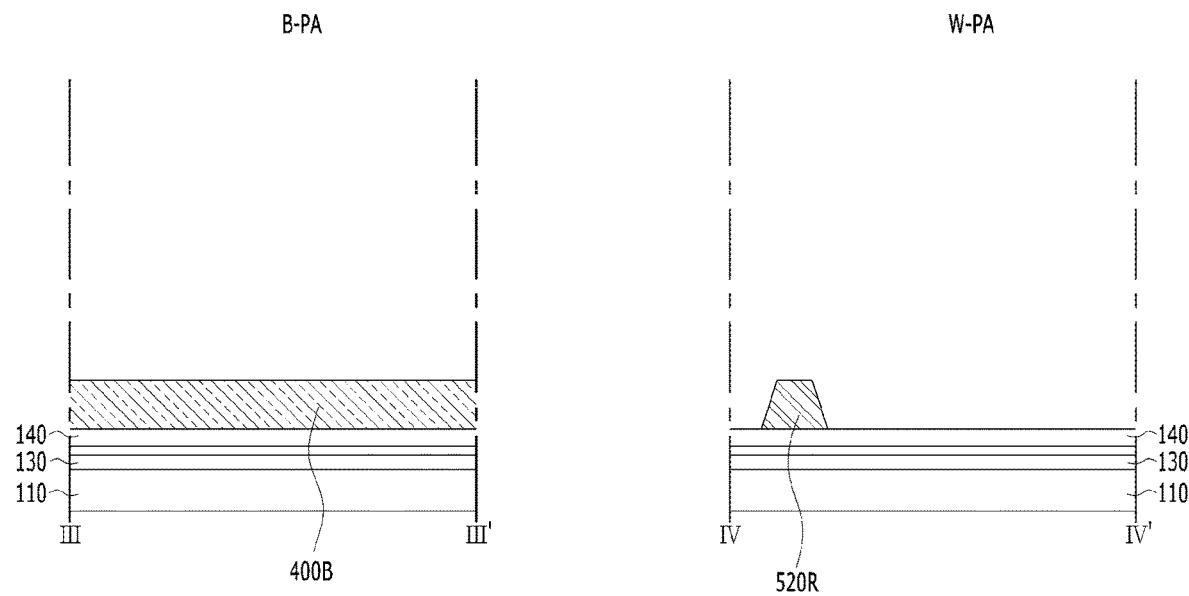

The method of forming the display device according to the embodiment of the present disclosure may include a step of forming at least one first red color conversion pattern 510R and at least one second red color conversion pattern 520R using the red color conversion material layer 500R, as shown in FIGS. 10A and 10B.

The step of forming the first red color conversion pattern 510R and the second red color conversion pattern 520R may include a step of patterning the red color conversion material layer 500R. For example, the step of forming the first red color conversion pattern 510R and the second red color conversion pattern 520R may include a step of forming a mask pattern including a first region overlapping with the red color filter 400R and second regions overlapping with the white pixel area W-PA of the lower substrate 110 on the red color conversion material layer 500R, and a step of removing the red color conversion material layer 500R exposed by the mask pattern.

The first red color conversion pattern 510R may be formed in the red penetrating hole 400RH of the red color filter 400R. The second red color conversion pattern 520R may be formed on the white pixel area W-PA of the lower substrate 110. Thus, in the method of forming the display device according to the embodiment of the present disclosure, a side surface of the second red color conversion pattern 520R may be tapered in a direction opposite to a side surface of the first red color conversion pattern 510R. The side surface of the second color conversion pattern 520R may be tapered in a direction same as a side surface of the red color filter 400R. For example, the side surface of the second red color conversion pattern 520R may be positively tapered.

Figure 11A:
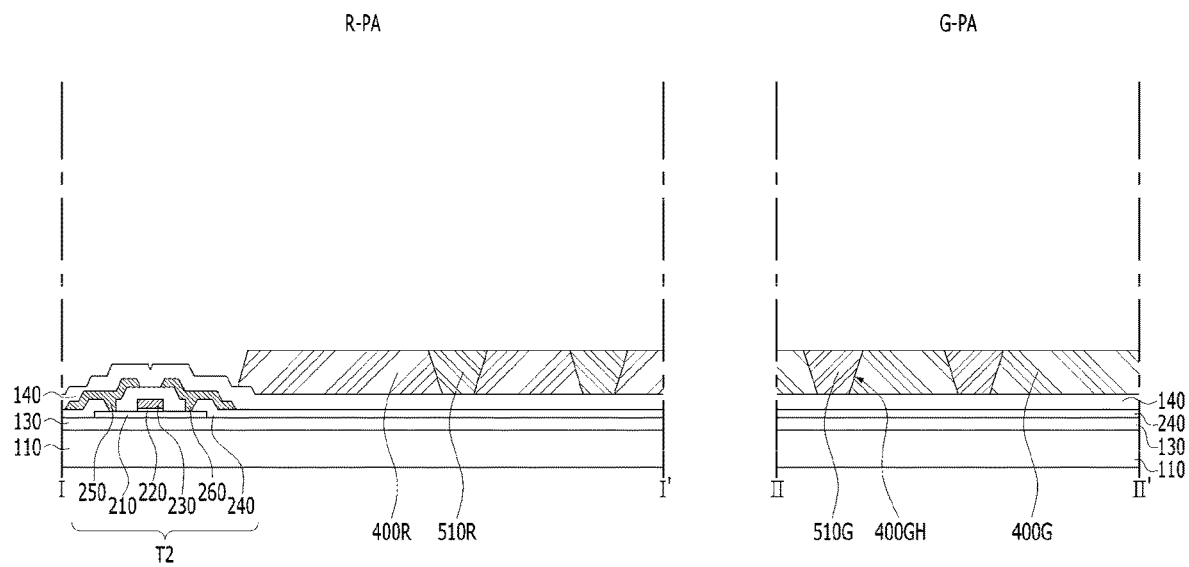
Figure 11B:
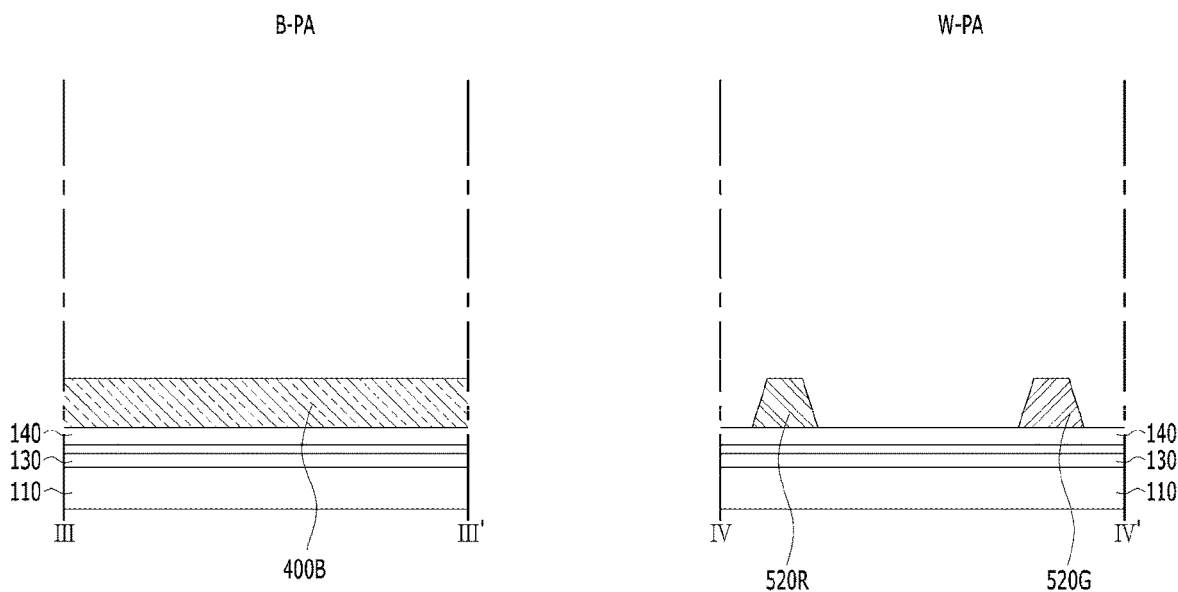

The method of forming the display device according to the embodiment of the present disclosure may include a step of forming at least one first green color conversion pattern 510G and at least one second green color conversion pattern 520G on the lower substrate 110 on which the first red color conversion pattern 510R and the second color conversion pattern 520R are formed, as shown, for example, in FIGS. 11A and 11B.

The first green color conversion pattern 510G and the second green color conversion pattern 520G may be formed in the same manner as the first red color conversion pattern 510R and the second red color conversion pattern 520R. For example, the step of forming the first green color conversion pattern 510G and the second green color conversion pattern 520G may include a step of forming a green color conversion material layer filling the green penetrating hole 400GH of the green color filter 400G, a step of performing etch-back of the green color conversion material layer, and a step of patterning the green color conversion material layer.

The first green color conversion pattern 510G may be formed in the green penetrating hole 400GH of the green color filter 400G. The second green color conversion pattern 520G may be formed on the white pixel area W-PA of the lower substrate 110. Thus, in the method of forming the display device according to the embodiment of the present disclosure, a side surface of the second green color conversion pattern 520G may be tapered in a direction opposite to the first green color conversion pattern 510G. The side surface of the second green color conversion pattern 520G may be tapered in a direction same as the side surface of the second red color conversion pattern 520R. For example, the side surface of the second green color conversion pattern 520G may be positively tapered. The second green color conversion pattern 520G may be spaced away from the second red color conversion pattern 520R.

The method of forming the display device according to the embodiment of the present disclosure may include a step of forming an over-coat layer 150 covering the color filters 400R, 400G and 400B, the first color conversion patterns 510R and 510G, and the second color conversion pattern 520R and 520G; a step of forming contact holes 140h and 150h penetrating the lower passivation layer 140 and the over-coat layer 150; a step of forming light-emitting structures 300R, 300G, 300B and 300W electrically connected to the driving circuit in the corresponding pixel area R-PA, G-PA, B-PA and W-PA through the contact holes 140h and 150h; a step of forming an upper passivation layer 170 on the light-emitting structures 300R, 300G, 300B and 300W; and a step of attaching the upper substrate 120 using an encapsulating layer 180.

Accordingly, the method of forming the display device according to the embodiment of the present disclosure may include a step of forming color filter 400R and 400G including at least one penetrating hole 400RH and 400GH on the red pixel area R-PA and the green pixel area G-PA which emit the light having a relatively long wavelength; and a step of forming first color conversion pattern 510R and 510G in the penetrating hole 400RH and 400GH, so that the characteristics of color realized in the red pixel area R-PA and the green pixel area G-PA may be improved without increasing overall thickness.

Also, in the method of forming the display device according to the embodiment of the present disclosure, the second color conversion pattern 520R and 520G may be simultaneously formed with the first color conversion pattern 510R and 510G on the white pixel area W-PA of the lower substrate 110, so that increasing a process time may be minimized and the color coordinate may be easily adjusted.

Figure 3A:
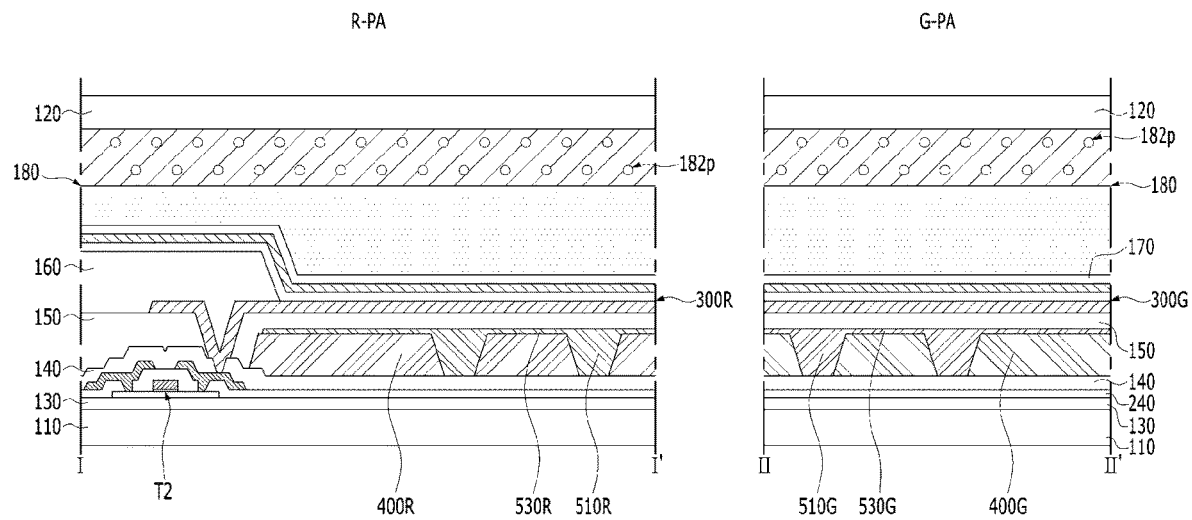
Figure 3B:
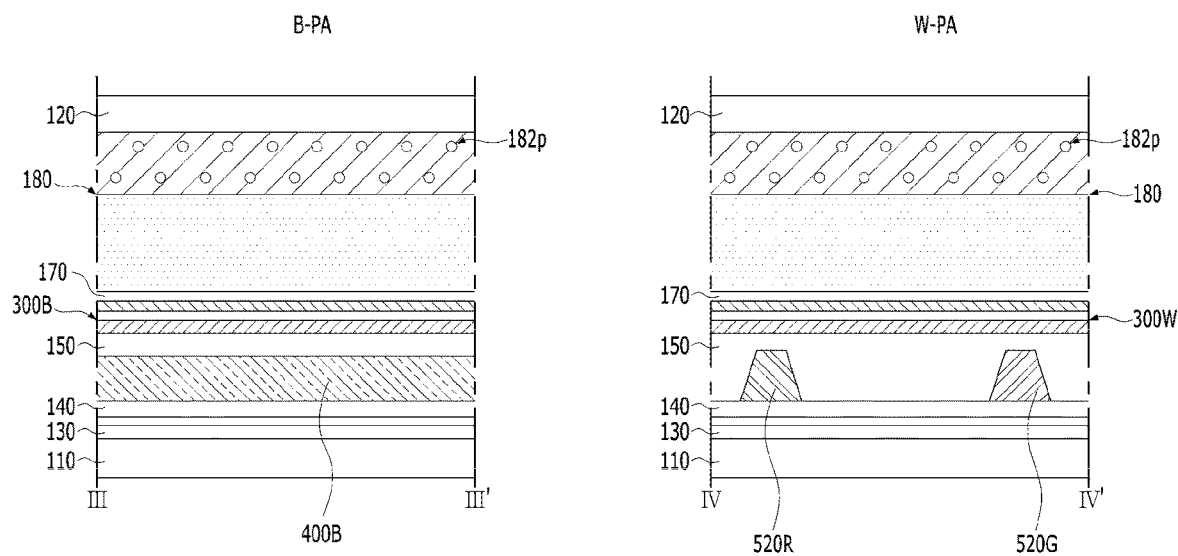

The method of forming the display device according to the embodiment of the present disclosure is described that the etch-back of the color conversion material layer 500R until exposing the upper surface of the color filters 400R, 400G and 400B is performed before forming the first color conversion pattern 510R and 510G, and the second color conversion pattern 520R and 520G. However, in the method of forming the display device according to another embodiment of the present disclosure, etch-back of the color conversion material layer may be performed so as to have a predetermined thickness on the upper surface of the color filters 400R, 400G and 400B. Thus, in the method of forming the display device according to another embodiment of the present disclosure, the color conversion layer 530R and 530G including a same material as the corresponding color conversion pattern 510R, 510G, 520R, 520G may be formed on the corresponding color filter 400R, 400G and 400B, as shown in FIGS. 3A and 3B.

Figure 12A:
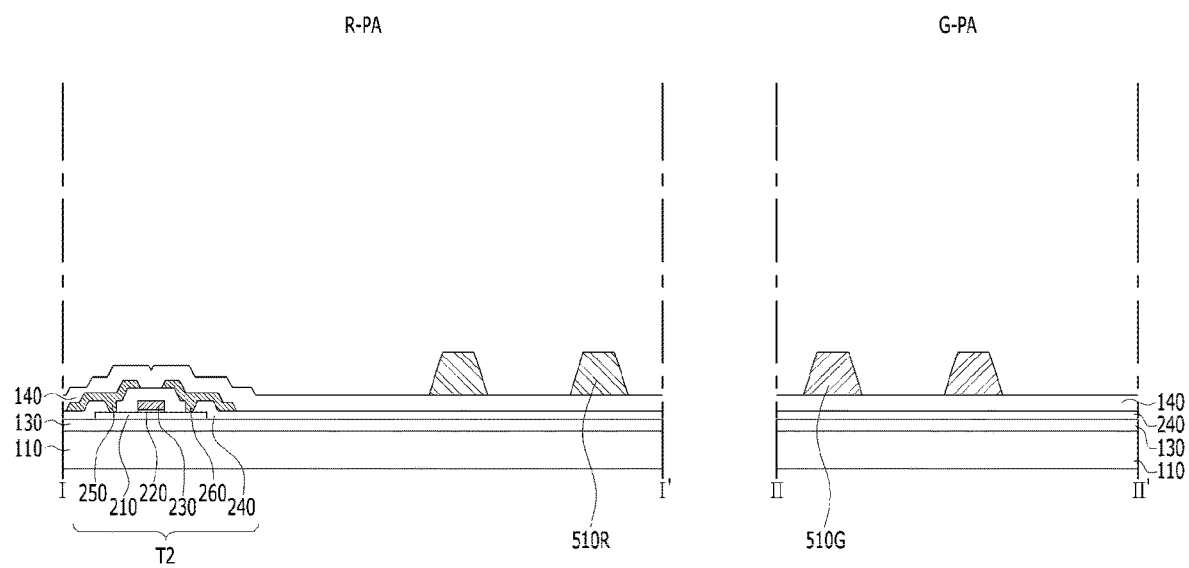
FIGS. 12A and 12B are views showing another method of forming the display device according to the embodiment of the present disclosure.
Figure 12B:
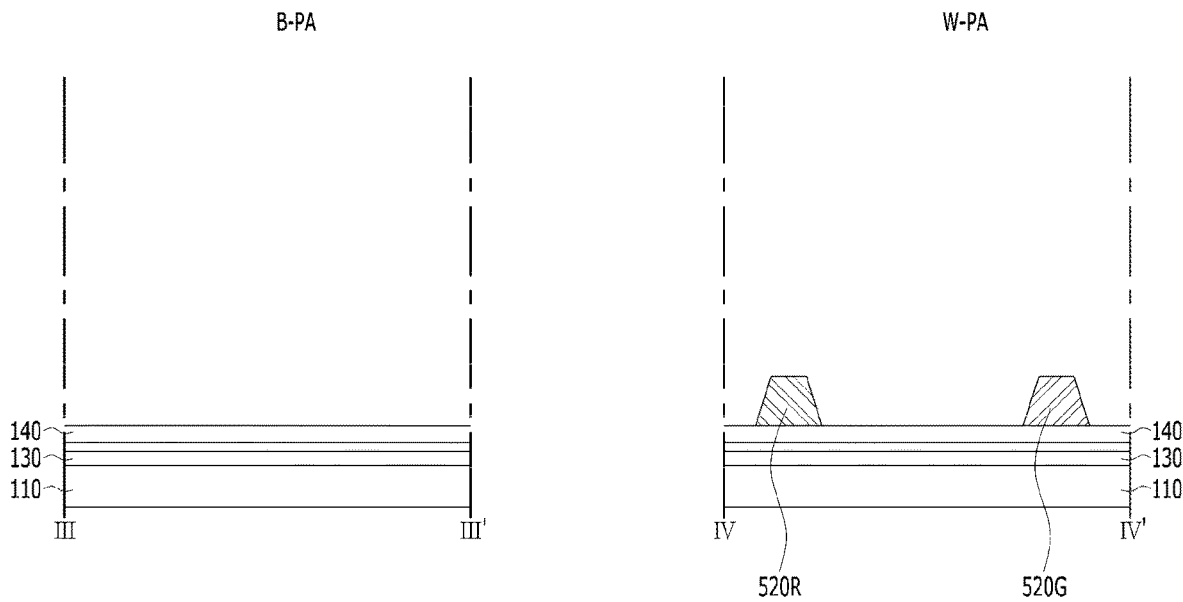

The method of forming the display device according to the embodiment of the present disclosure is described that the color conversion patterns 510R, 510G, 520R, 520G are formed after forming the color filters 400R, 400G and 400B. However, the method of forming the display device according to another embodiment of the present disclosure may form the color conversion pattern 510R, 510G, 520R and 520G before forming the color filter 400R, 400G and 400B, as shown in FIGS. 12A and 12B. Thus, in the method of forming the display device according to another embodiment of the present disclosure, the side surface of the second color conversion patterns 520R and 520G may be formed to be tapered in the same direction as the side surface of the first color conversion patterns 510R and 510G, as shown in FIGS. 4A and 4B.

In the result, the display device according to the embodiments of the present invention may include a color conversion pattern disposed side by side with a color filter on a pixel area on which the color filter is disposed. Thus, in the display device according to the embodiments of the present disclosure, the characteristics of color realized the pixel area on which the color filter is disposed, may be improved. Thereby, in the display device according to the embodiments of the present disclosure, the color coordinate may be easily and efficiently adjusted, and the color gamut may be increased.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a first substrate including a pixel region;
a second substrate on the first substrate, the second substrate overlapping with the pixel region;

a color filter between the first substrate and the second substrate, the color filter including a penetrating hole in the pixel region; and
a color conversion pattern in the penetrating hole of the color filter,
wherein the color conversion pattern realizes a color that is the same as the color filter,
wherein each of the color filter and the color conversion pattern includes a lower surface facing toward the first substrate, an upper surface facing toward the second substrate, and a side surface between the lower surface and the upper surface,
wherein an entire of the side surface of the color filter in the penetrating hole of the color filter contacts with an entire of the side surface of the color conversion pattern in the penetrating hole of the color filter,
wherein the lower surface of the color conversion pattern is disposed outside the lower surface of the color filter in the pixel region, and
wherein the upper surface of the color conversion pattern is disposed outside the upper surface of the color filter in the pixel region.

2. The display device according to claim 1, wherein the side surface of the color filter and the side surface of the color conversion pattern are tapered, and the side surface of the color conversion pattern is tapered in a direction opposite to the side surface of the color filter.

3. The display device according to claim 2, wherein the side surface of the color filter is positively tapered.

4. The display device according to claim 1, further comprising:
a color conversion layer between the color filter and the second substrate, the color conversion layer extending between the color conversion pattern and the second substrate;
a light-emitting structure between the color conversion layer and the second substrate, the light-emitting structure including a first electrode, a light-emitting layer, and second electrode, which are sequentially stacked in the pixel region; and
an over-coat layer between the color conversion layer and the light-emitting structure.

5. The display device according to claim 4, wherein a thickness of the color conversion layer is thinner than a thickness of the color filter.

6. The display device according to claim 4, wherein the color conversion layer includes a material that is the same as a material of the color conversion pattern.

7. The display device according to claim 1, wherein a thickness of the color conversion pattern is substantially the same as a thickness of the color filter.

8. The display device according to claim 1,
wherein the lower surface of the color conversion pattern is coplanar with the lower surface of the color filter.

9. A display device, comprising:
a first substrate including a white pixel region realizing white color, and a first pixel region realizing non-white color;
a first color filter on the first pixel region of the first substrate, the first color filter including at least one first penetrating hole;
a first color conversion pattern in the first penetrating hole of the first color filter, the first color conversion pattern realizing a color that is the same as the first color filter; and
at least one second color conversion pattern on the white pixel region of the first substrate, the second color conversion pattern having a material that is the same as a material of the first color conversion pattern,
wherein the first color filter includes a first filter lower surface facing toward the first substrate, a first filter upper surface opposite to the first substrate, and a first filter side surface between the first filter lower surface and the first filter upper surface,
wherein the first color conversion pattern includes a first conversion lower surface on the same layer as the first filter lower surface of the first color filter in the first pixel region, a first conversion upper surface on the same layer as the first filter upper surface of the first color filter in the first pixel region, and a first conversion side surface between the first conversion lower surface and the first conversion upper surface, and
wherein an entire of the first filter side surface of the first color filter in the first penetrating hole of the first color filter contacts with an entire of the first conversion side surface of the first color conversion pattern in the first penetrating hole of the first filter.

10. The display device according to claim 9, wherein a number of the second color conversion pattern is different from a number of the first color conversion pattern.

11. The display device according to claim 9, wherein a side surface of the second color conversion pattern is tapered in substantially the same direction as the first conversion side surface of the first color conversion pattern.

12. The display device according to claim 9, wherein the second color conversion pattern has a thickness that is substantially the same as a thickness of the first color conversion pattern.

13. The display device according to claim 9, wherein the first substrate includes a second pixel region, the display device further including:
a second color filter on the second pixel region of the first substrate, the second color filter including a second penetrating hole;
at least one third color conversion pattern in the second penetrating hole of the second color filter; and
at least one fourth color conversion pattern on the white pixel region of the first substrate, the second pixel region realizes a color different from the white pixel region and the first pixel region,
wherein the second color filter includes a second filter lower surface facing toward the first substrate, a second filter upper surface opposite to the first substrate, and a second filter side surface between the second filter lower surface and the second filter upper surface,
wherein the third color conversion pattern includes a second conversion lower surface facing toward the first substrate, a second conversion upper surface opposite to the first substrate, and a second conversion side surface between the second conversion lower surface and the second conversion upper surface, and
wherein the second filter side surface of the second color filter contacts with the second conversion side surface of the third color conversion pattern.

14. The display device according to claim 13, wherein a number of the third color conversion pattern is different from a number of the first color conversion pattern.

15. The display device according to claim 13, wherein a number of the fourth color conversion pattern is different from a number of the second color conversion pattern.

16. A display device, comprising:
a first substrate including a red pixel region, a green pixel region, a blue pixel region, and a white pixel region;

a first red color conversion pattern on the red pixel region of the first substrate, the first red color conversion pattern configured to convert light to have a red color;

a red color filter on the red pixel region of the first substrate, the red color filter including a red penetrating hole, the red color filter configured to filter light to have the red color, the first red color conversion pattern in the red penetrating hole of the red color filter;

a first green color conversion pattern on the green pixel region of the first substrate, the first green color conversion pattern configured to convert light to have a green color;

a green color filter on the green pixel region of the first substrate, the green color filter including a green penetrating hole, the green color filter configured to filter light to have the green color, the first green color conversion pattern in the green penetrating hole of the green color filter;

a blue color filter on the blue pixel region of the first substrate, the blue color filter configured to filter light to have a blue color;

a second red color conversion pattern on the white pixel region of the first substrate; and a second green color conversion pattern on the white pixel region of the first substrate, wherein each of the red color filter, the first red color conversion pattern, the green color filter, and the first green color conversion pattern includes a lower surface facing toward the first substrate, an upper surface opposite to the first substrate, and a side surface between the lower surface and the upper surface, wherein an entire of the side surface of the red color filter in the red penetrating hole of the red color filter contacts with an entire of the side surface of the first red color conversion pattern in the red penetrating hole of the red color filter, wherein an entire of the side surface of the green color filter in the green penetrating hole of the green color filter contacts with an entire of the side surface of the first green color conversion pattern in the green penetrating hole of the green color filter, wherein the lower surface and the upper surface of the first red color conversion pattern are disposed outside the red color filter in the red pixel region, and wherein the lower surface and the upper surface of the first green color conversion pattern are disposed outside the green color filter in the green pixel region.

17. The display device according to claim 16, wherein a thickness of the second red color conversion pattern is greater than a thickness of the first red color conversion pattern, and a thickness of the second green color conversion pattern is greater than a thickness of the first green color conversion pattern.

18. The display device according to claim 17, further comprising:

a second substrate on the first red color conversion pattern, the red color filter, the first green color conversion pattern, the green color filter, the blue color filter, the second red color conversion pattern, and the second green color conversion pattern;

a red color conversion layer on the red color filter and the first red color conversion pattern, the red color filter and the first red color conversion pattern being spaced from the second substrate by the red color conversion layer; and a green color conversion layer on the green color filter and the first green color conversion pattern, the green color filter and the first green color conversion pattern being spaced from the second substrate by the green color conversion layer, a surface of the second red color conversion pattern being substantially coplanar with a surface of the red color conversion layer, and a surface of the second green color conversion pattern being substantially coplanar with a surface of the green color conversion layer.

19. The display device according to claim 17, wherein a side surface of the second red color conversion pattern and a side surface of the second green color conversion pattern are tapered in a direction opposite to the side surface of the first red color conversion pattern and the side surface of the first green color conversion pattern.

20. The display device according to claim 19, wherein the side surface of the first red color conversion pattern and the side surface of the first green color conversion pattern are negatively tapered.

* * * * *